(12) United States Patent
Donofrio et al.

(10) Patent No.: US 9,754,926 B2
(45) Date of Patent: Sep. 5, 2017

(54) LIGHT EMITTING DIODE (LED) ARRAYS INCLUDING DIRECT DIE ATTACH AND RELATED ASSEMBLIES

(75) Inventors: Matthew Donofrio, Raleigh, NC (US); John Adam Edmond, Durham, NC (US); Hua-Shuang Kong, Cary, NC (US); Peter S. Andrews, Durham, NC (US); David Todd Emerson, Chapel Hill, NC (US)

(73) Assignee: CREE, INC., Durham, NC (US)

( * ) Notice: Subject to any disclaimer, the term of this patent is extended or adjusted under 35 U.S.C. 154(b) by 383 days.

(21) Appl. No.: 13/027,006

(22) Filed: Feb. 14, 2011

(65) Prior Publication Data

US 2012/0193649 A1     Aug. 2, 2012

Related U.S. Application Data

(63) Continuation-in-part of application No. 13/018,013, filed on Jan. 31, 2011, now Pat. No. 9,640,737.

(51) Int. Cl.
*H01L 27/15* (2006.01)
*H01L 25/075* (2006.01)
(Continued)

(52) U.S. Cl.
CPC ........ *H01L 25/0753* (2013.01); *H01L 33/505* (2013.01); *H01L 33/62* (2013.01); *H01L 2224/16* (2013.01)

(58) Field of Classification Search
CPC ... H01L 25/0753; H01L 33/505; H01L 33/62; H01L 2224/16
(Continued)

(56) References Cited

U.S. PATENT DOCUMENTS 4,916,464 A * 4/1990 Ito et al. .................. 347/237
4,918,497 A   4/1990 Edmond
(Continued)

FOREIGN PATENT DOCUMENTS

CN         101449396      6/2009
DE    10 2007 029369 A1  1/2009
(Continued)

OTHER PUBLICATIONS

International Search Report Corresponding to International Application No. PCT/US2012/037209; dated Aug. 6, 2012; 12 Pages.
(Continued)

*Primary Examiner* — Ori Nadav
(74) *Attorney, Agent, or Firm* — Sage Patent Group

(57) ABSTRACT

An electronic device may include a packaging substrate having a packaging substrate face with a plurality of electrically conductive pads on the packaging substrate face. A first light emitting diode die may bridge first and second ones of the electrically conductive pads. More particularly, the first light emitting diode die may include first anode and cathode contacts respectively coupled to the first and second electrically conductive pads using metallic bonds. Moreover, widths of the metallic bonds between the first anode contact and the first pad and between the first cathode contact and the second pad may be at least 60 percent of a width of the first light emitting diode die. A second light emitting diode die may bridge third and fourth ones of the electrically conductive pads. The second light emitting diode die may include second anode and cathode contacts respectively coupled to the third and fourth electrically conductive pads using metallic bonds. Widths of the metallic bonds between the second anode contact and the second pad and between the second cathode contact and the third pad
(Continued)

may be at least 60 percent of a width of the first light emitting diode die.

7 Claims, 22 Drawing Sheets

(51) Int. Cl.
  *H01L 33/50* (2010.01)
  *H01L 33/62* (2010.01)
(58) Field of Classification Search
  USPC ............................. 257/79–81, 98–100
  See application file for complete search history.

(56) References Cited

U.S. PATENT DOCUMENTS

| | | | |
|---|---|---|---|
| 4,966,862 A | 10/1990 | Edmond | |
| 5,027,168 A | 6/1991 | Edmond | |
| 5,210,051 A | 5/1993 | Carter, Jr. | |
| 5,309,001 A * | 5/1994 | Watanabe et al. | 257/99 |
| 5,337,179 A | 8/1994 | Hodges | |
| 5,338,944 A | 8/1994 | Edmond et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,696,389 A | 12/1997 | Ishikawa et al. | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,614,056 B1 * | 9/2003 | Tarsa et al. | 257/91 |
| 6,853,010 B2 | 2/2005 | Slater et al. | |
| 6,871,982 B2 | 3/2005 | Holman et al. | |
| 6,964,877 B2 | 11/2005 | Chen et al. | |
| 7,081,667 B2 * | 7/2006 | Du | 257/668 |
| 7,141,825 B2 * | 11/2006 | Horio et al. | 257/79 |
| 7,262,467 B2 * | 8/2007 | Kelberlau | 257/355 |
| 7,285,801 B2 | 10/2007 | Eliashevich et al. | |
| 7,326,583 B2 | 2/2008 | Andrews et al. | |
| 7,442,564 B2 | 10/2008 | Andrews | |
| 7,476,337 B2 | 1/2009 | Sakane et al. | |
| 7,521,728 B2 | 4/2009 | Andrews | |
| 7,646,035 B2 | 1/2010 | Loh et al. | |
| 7,652,298 B2 | 1/2010 | Chen et al. | |
| 7,737,634 B2 | 6/2010 | Leng et al. | |
| 7,800,125 B2 | 9/2010 | Chen | |
| 7,852,009 B2 | 12/2010 | Coleman et al. | |
| 7,854,365 B2 | 12/2010 | Li et al. | |
| 8,008,850 B2 * | 8/2011 | Su et al. | 313/498 |
| 8,067,783 B2 * | 11/2011 | Wirth | 257/99 |
| 8,115,217 B2 * | 2/2012 | Duong et al. | 257/88 |
| 8,492,777 B2 | 7/2013 | Hsieh et al. | |
| 8,610,145 B2 | 12/2013 | Yano | |
| 2002/0123164 A1 | 9/2002 | Slater et al. | |
| 2003/0006418 A1 | 1/2003 | Emerson et al. | |
| 2003/0089918 A1 | 5/2003 | Hiller et al. | |
| 2004/0056260 A1 | 3/2004 | Slater et al. | |
| 2004/0080938 A1 | 4/2004 | Holman et al. | |
| 2004/0218390 A1 | 11/2004 | Holman et al. | |
| 2004/0228115 A1 | 11/2004 | Jacobson et al. | |
| 2005/0127485 A1 | 6/2005 | Shei et al. | |
| 2005/0179375 A1 | 8/2005 | Kim et al. | |
| 2005/0211989 A1 | 9/2005 | Horio et al. | |
| 2006/0091415 A1 | 5/2006 | Yan | |
| 2006/0113555 A1 * | 6/2006 | Yang | 257/99 |
| 2006/0124953 A1 | 6/2006 | Negley et al. | |
| 2006/0163589 A1 | 7/2006 | Fan et al. | |
| 2006/0192223 A1 * | 8/2006 | Lee et al. | 257/99 |
| 2006/0208271 A1 | 9/2006 | Kim et al. | |
| 2006/0255353 A1 | 11/2006 | Taskar et al. | |
| 2007/0200128 A1 | 8/2007 | Yano | |
| 2008/0035947 A1 | 2/2008 | Weaver, Jr. et al. | |
| 2008/0089053 A1 | 4/2008 | Negley | |
| 2008/0217635 A1 | 9/2008 | Emerson et al. | |
| 2008/0315214 A1 | 12/2008 | Wall et al. | |
| 2009/0050907 A1 | 2/2009 | Yuan et al. | |
| 2009/0050908 A1 * | 2/2009 | Yuan et al. | 257/88 |
| 2009/0108281 A1 | 4/2009 | Keller et al. | |
| 2009/0140633 A1 * | 6/2009 | Tanimoto et al. | 313/503 |
| 2009/0145647 A1 | 6/2009 | Tanaka et al. | |
| 2009/0161420 A1 | 6/2009 | Shepard | |
| 2009/0166653 A1 | 7/2009 | Weaver, Jr. et al. | |
| 2009/0179207 A1 | 7/2009 | Chitnis et al. | |
| 2009/0283787 A1 * | 11/2009 | Donofrio et al. | 257/98 |
| 2009/0283789 A1 * | 11/2009 | Kim et al. | 257/99 |
| 2009/0296384 A1 | 12/2009 | Van De Ven et al. | |
| 2009/0315061 A1 | 12/2009 | Andrews | |
| 2010/0066229 A1 | 3/2010 | Hamby et al. | |
| 2010/0109030 A1 | 5/2010 | Krames et al. | |
| 2010/0140648 A1 | 6/2010 | Harada et al. | |
| 2010/0155763 A1 | 6/2010 | Donofrio et al. | |
| 2010/0230693 A1 | 9/2010 | Tran | |
| 2010/0308354 A1 | 12/2010 | David et al. | |
| 2011/0006334 A1 | 1/2011 | Ishii et al. | |
| 2011/0018013 A1 | 1/2011 | Margalith et al. | |
| 2011/0101389 A1 | 5/2011 | Wu | |
| 2011/0114989 A1 | 5/2011 | Suehiro et al. | |
| 2012/0146066 A1 | 6/2012 | Tischler et al. | |
| 2012/0161161 A1 | 6/2012 | Schubert | |

FOREIGN PATENT DOCUMENTS

| | | |
|---|---|---|
| EP | 1 670 073 A1 | 6/2006 |
| EP | 2 151 873 A2 | 2/2010 |
| JP | 2010-114144 A | 5/2010 |

OTHER PUBLICATIONS

Chen, K. et al., "Intergration of Phosphor Printing and Encapsulant Dispensing Processes for Wafer Level LED Array Packaging", *2010 11th International Conference on Electronic Packaging Technology & High Density Packaging*, Aug. 2010, pp. 1386-1392.
International Search Report Corresponding to International Application No. PCT/US12/24580; dated Jun. 22, 2012; 14 Pages.
"Cree XLamp® XP-E High Efficiency White LEDs Data Sheet" Data Sheet: CLD-DS34 Rev 0, pp. 1-11, 2010.
International Search Report Corresponding to International Application No. PCT/US13/21968; dated Apr. 5, 2013; 17 Pages.
International Search Report Corresponding to International Application No. PCT/US13/21975; dated Apr. 16, 2013; 9 Pages.
International Preliminary Report on Patentability Corresponding to International Application No. PCT/US2013/021968; dated Jul. 31, 2014; 14 Pages.
International Preliminary Report on Patentability Corresponding to International Application No. PCT/US2013/021975; dated Jul. 31, 2014; 7 Pages.
International Preliminary Report on Patentability Corresponding to International Application No. PCT/US2012/037209; dated Nov. 28, 2013; 8 Pages.
Notification of Transmittal of the International Search Report and the Written Opinion of the International Searching Authority, or the Declaration, in corresponding PCT Application No. PCT/US2012/021631; dated May 17, 2012; 9 Pages.
Notification Concerning Transmittal of International Preliminary Report on Patentability, in corresponding PCT Application No. PCT/US2012/021631; dated Mar. 20, 2014; 8 Pages.
European Search Report Corresponding to European Application No. 12 74 2154; dated Sep. 9, 2015; 7 Pages.
Chinese Office Action, corresponding Chinese Patent Applicatin. No. 201280030330.4, dated Nov. 30, 2015, 6 pages.

* cited by examiner

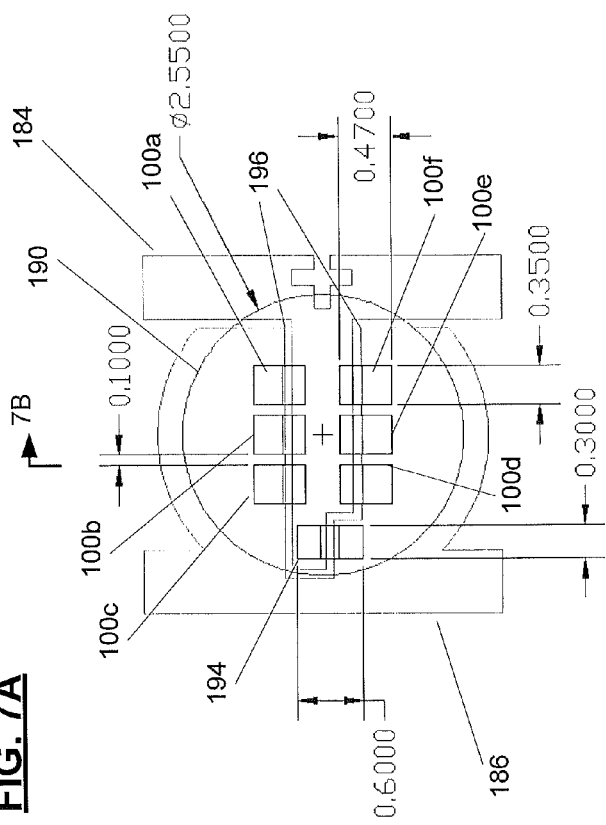
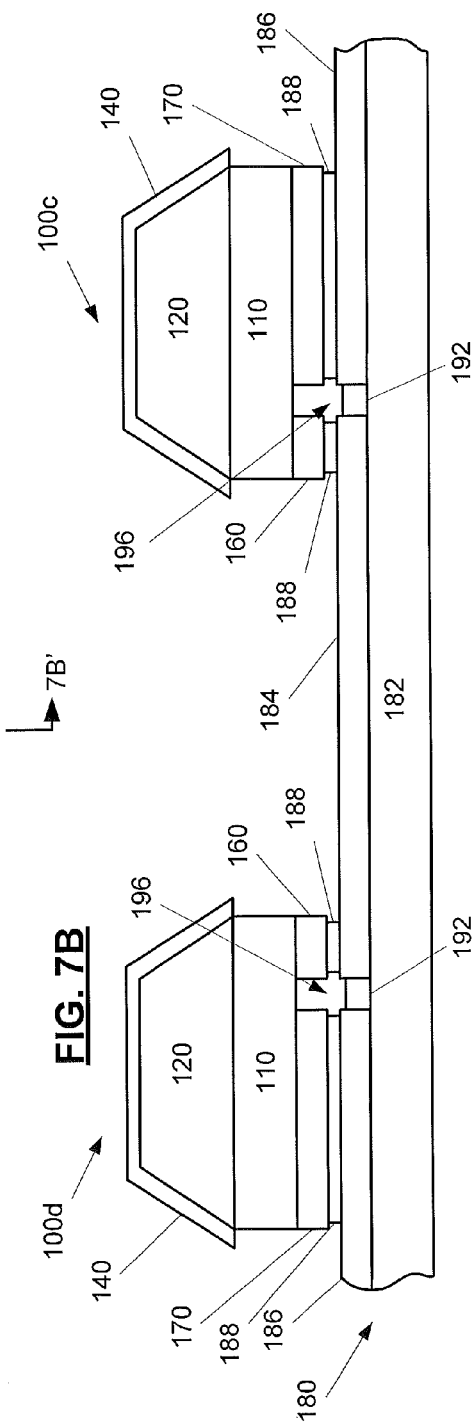
FIG. 7A
FIG. 7B

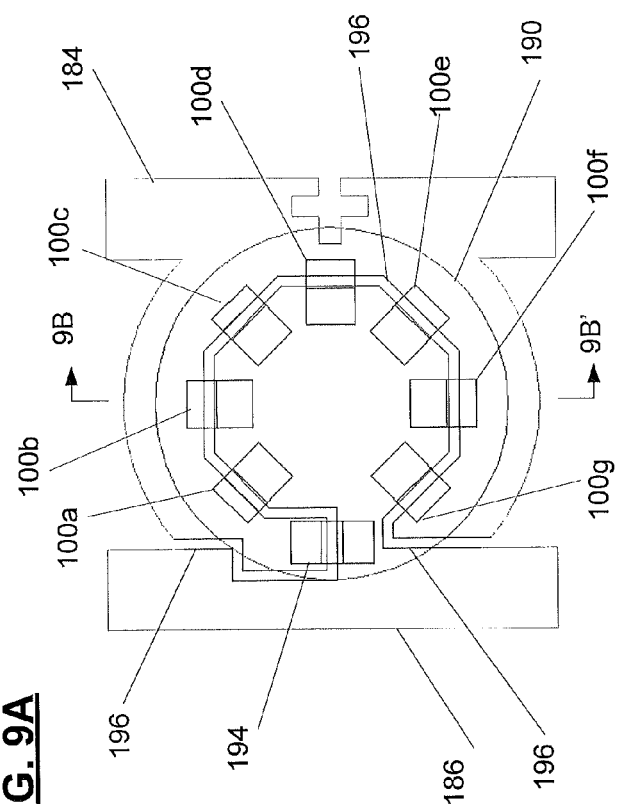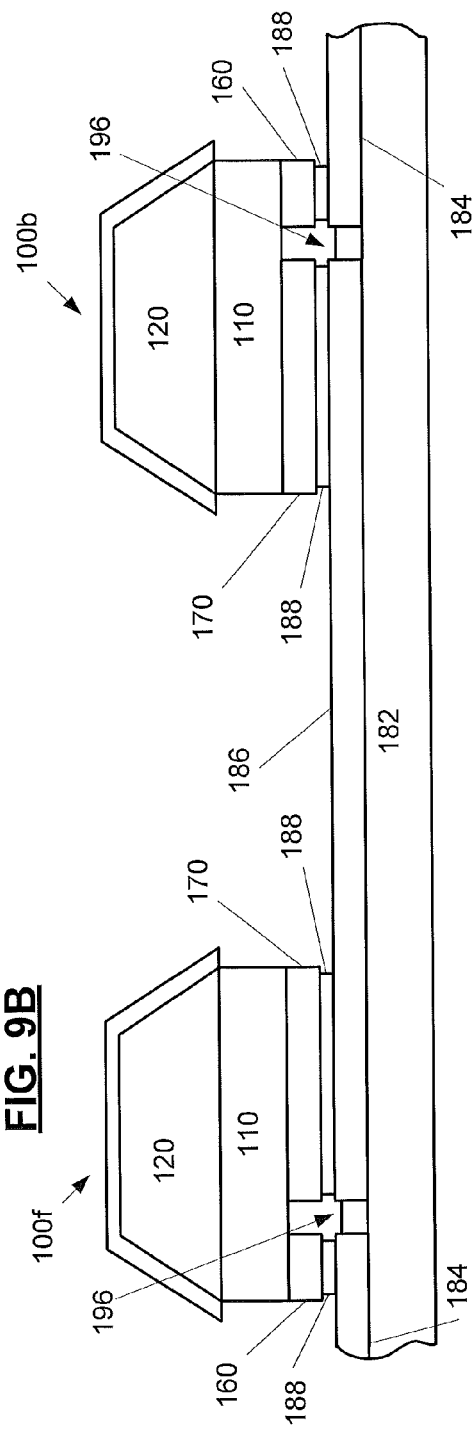
FIG. 9A
FIG. 9B

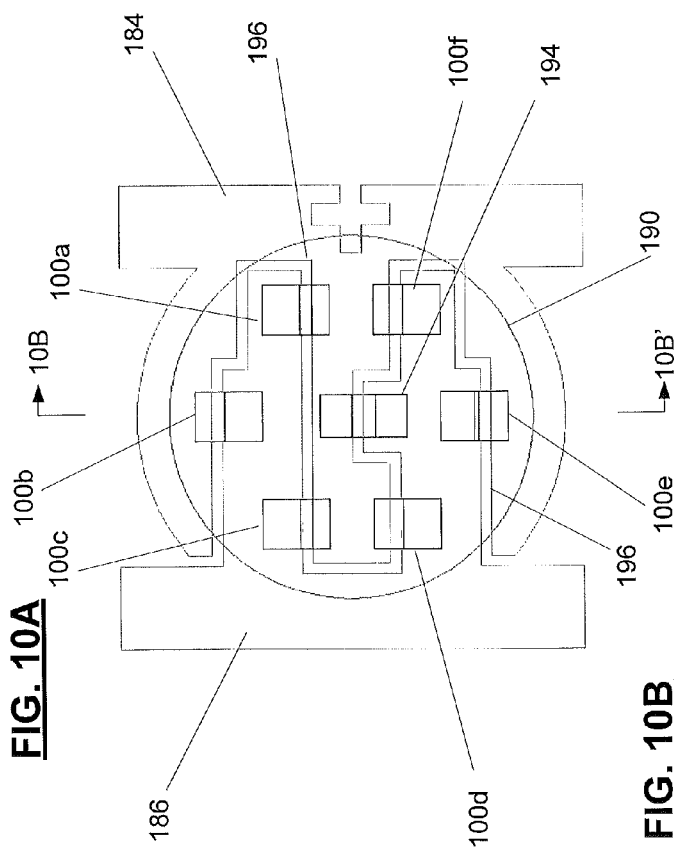
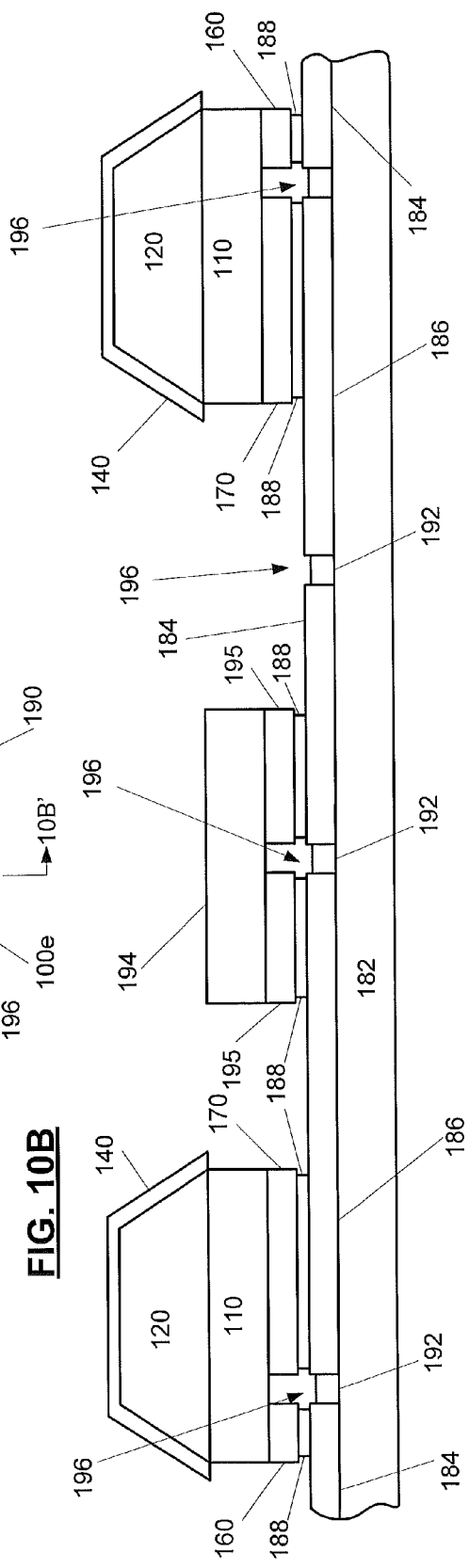
FIG. 10A
FIG. 10B

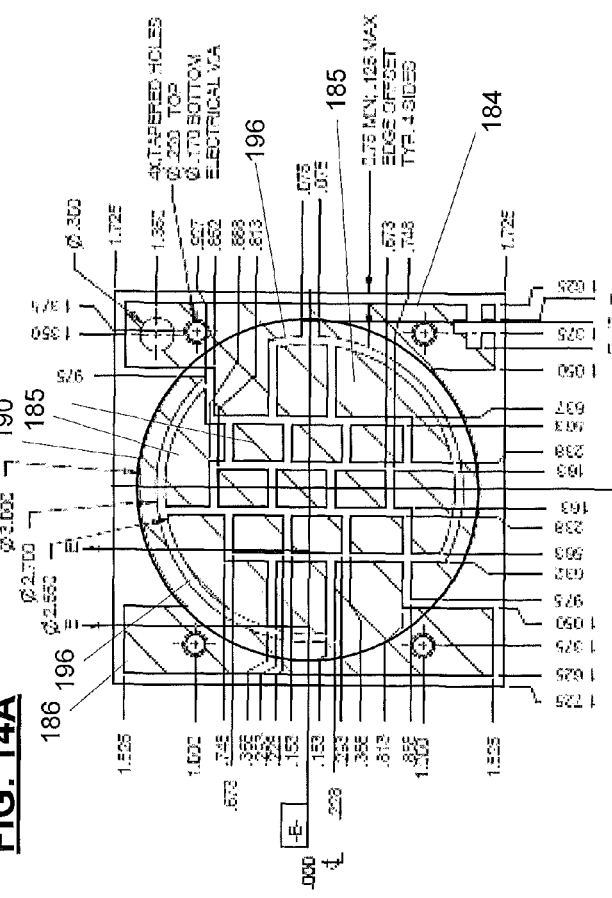
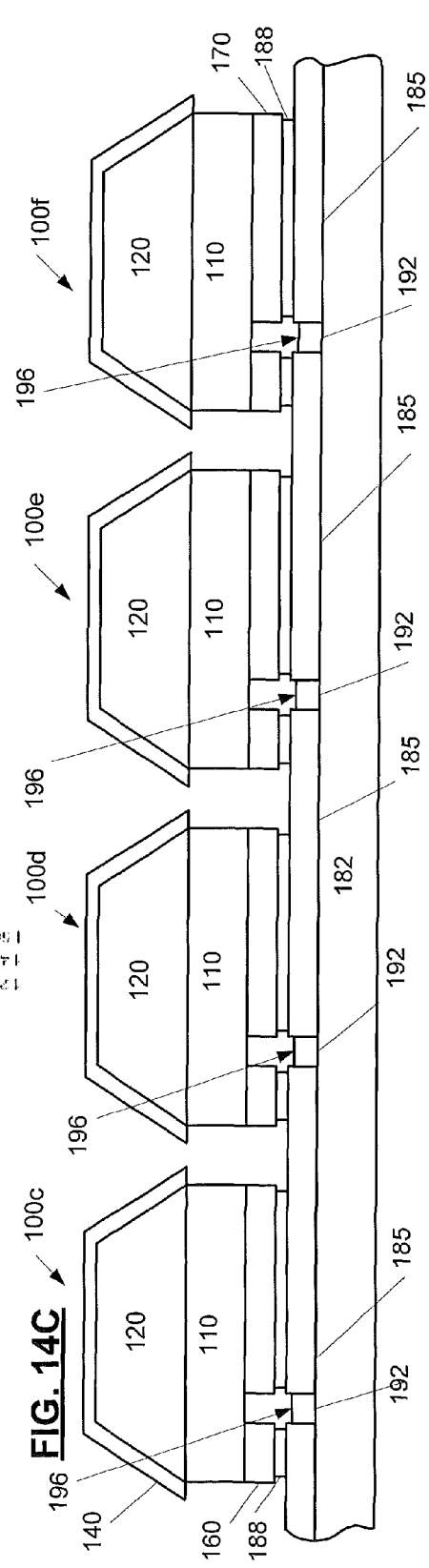
FIG. 14A
FIG. 14B
FIG. 14C

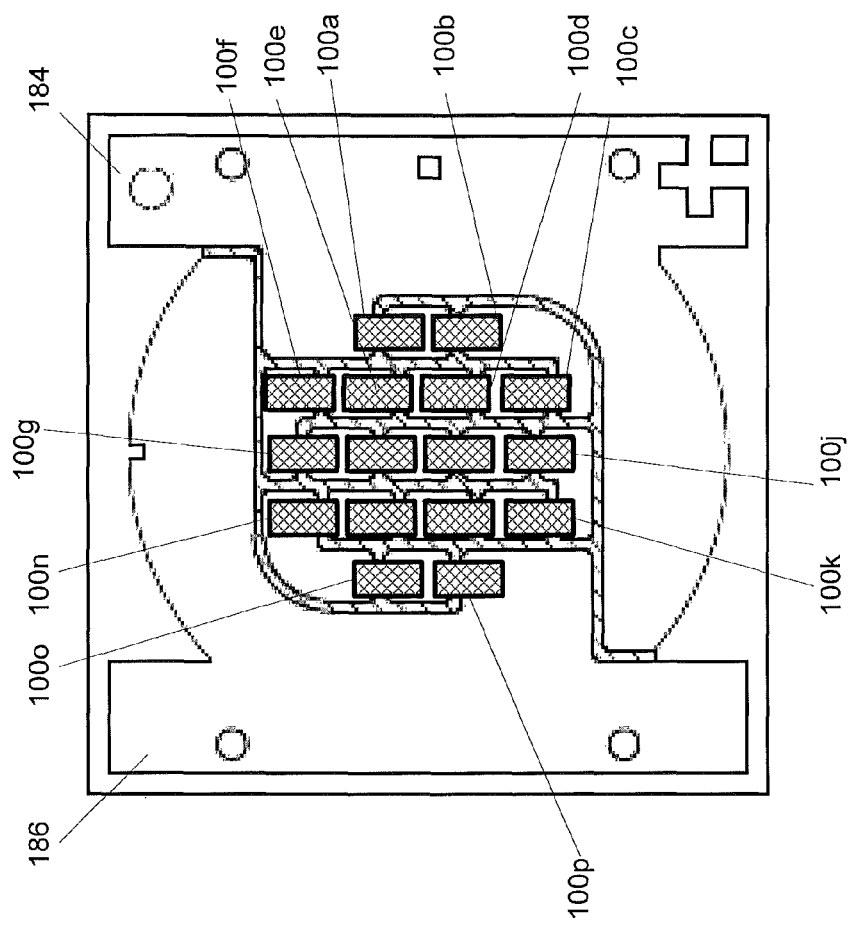
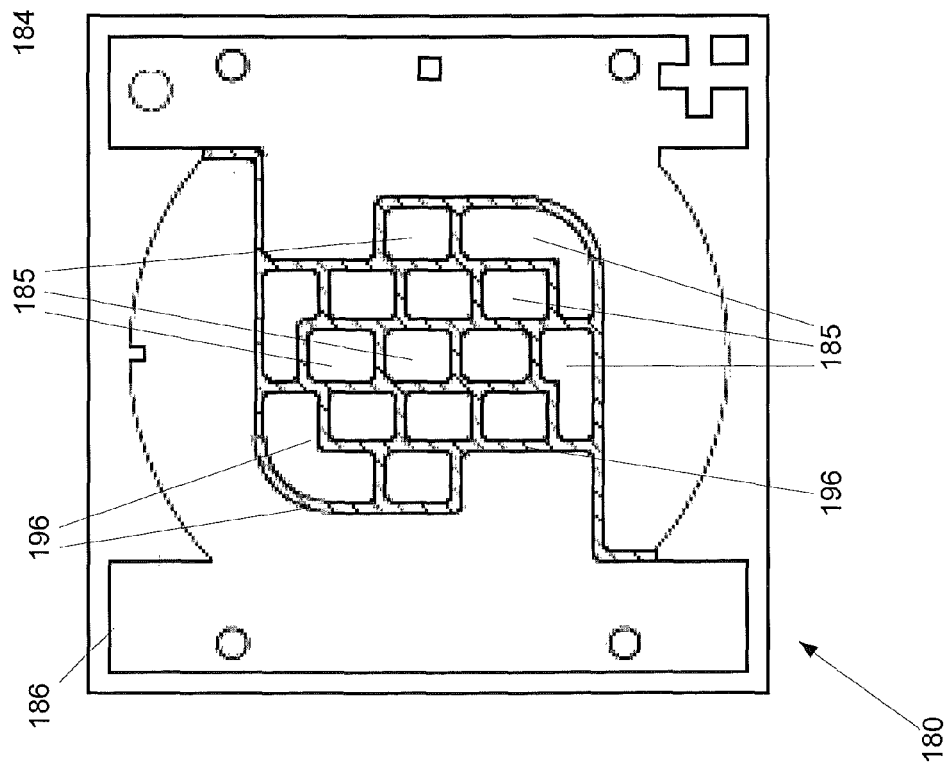

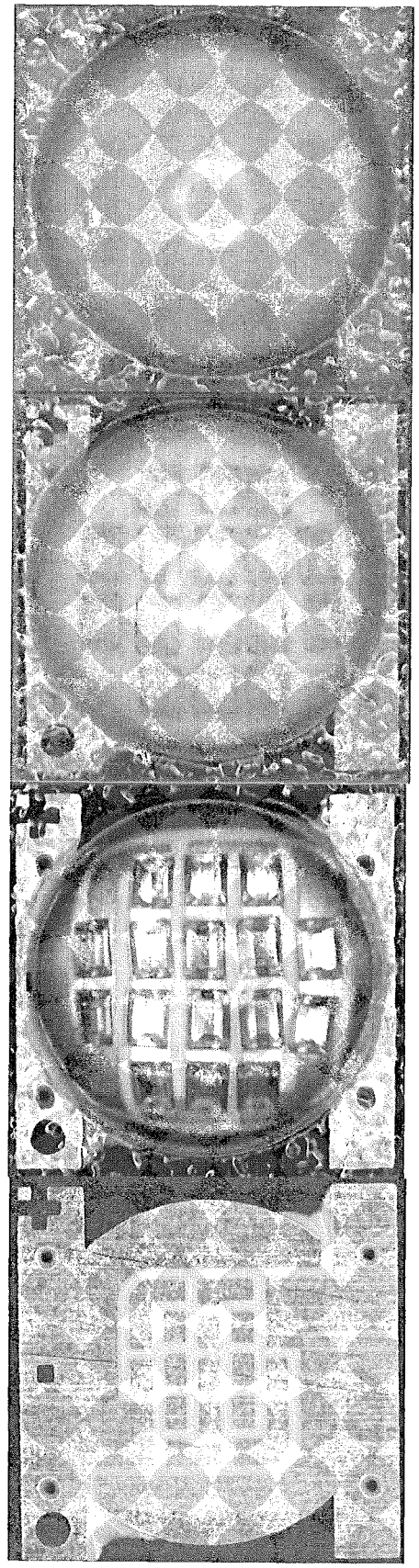

LIGHT EMITTING DIODE (LED) ARRAYS INCLUDING DIRECT DIE ATTACH AND RELATED ASSEMBLIES

RELATED APPLICATION

The present application claims the benefit of priority as a continuation-in-part (CIP) of U.S. application Ser. No. 13/018,013 filed Jan. 31, 2011, now U.S. Pat. No. 9,640,737 and entitled "Horizontal Light Emitting Diodes Including Phosphor Particles", the disclosure of which is hereby incorporated herein in its entirety by reference.

BACKGROUND

This invention relates to semiconductor light emitting devices and assemblies and methods of manufacturing the same, and more particularly, to semiconductor Light Emitting Diodes (LEDs) and assemblies thereof.

Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

LEDs are increasingly being used in lighting/illumination applications, with a goal being to provide a replacement for ubiquitous incandescent and fluorescent lighting. To accomplish the goal of replacing traditional lighting with LED lighting, LED lighting designers are faced with stringent dimensional, energy efficiency and luminous flux output requirements. Such requirements have caused LED designers to produce LED arrays in varying arrangements. Typical LED arrangements involve the use of wire bonds. The use of wire bonds creates a constraint on the density with which individual LED chips can be packaged together due to mechanical or manufacturing constraints and problems with light absorption, for example due to the wire bond pads. The use of monolithic LED chip arrays can resolve some of the issues with wire bond pads, but the monolithic LED chips may add increased costs, limited shapes and reduced yield.

SUMMARY

In certain embodiments, the present invention provides small area LEDs with LED arrays for various applications, such as higher voltage applications, where LED chip bonding area is more efficiently utilized to balance the practical aspects of maintaining a chip spacing that provides ease of manufacture, improved yield and/or less light absorption to provide more efficient and/or improved light output. Depending on the dimensional requirements and desired operating voltage, the packaged LED array can provide different serial/parallel configurations. The packaged LED array can use wirebond-free LEDs which are individually selected and/or reflow bonded to a packaging substrate. In certain embodiments, the packaging substrate includes small conductive islands, and LED chips can bridge the smaller conductive islands to electrically couple the LED chips in series. The packaging substrate can include larger conductive islands or contiguous conductive pads to electrically couple the LED chips in parallel. In some embodiments, different sized and/or shaped conductive pads or islands can be used to provide the desired serial and/or parallel configuration for the LED array in a desired shape.

According to some embodiments, an electronic device may include a packaging substrate having a packaging substrate face with a plurality of electrically conductive pads on the packaging substrate face. A first light emitting diode die may bridge first and second ones of the electrically conductive pads, and the first light emitting diode die may include first anode and cathode contacts respectively coupled to the first and second electrically conductive pads using metallic bonds. More particularly, widths of the metallic bonds between the first anode contact and the first pad and between the first cathode contact and the second pad may be at least 60 percent of a width of the first light emitting diode die. A second light emitting diode die may bridge third and fourth ones of the electrically conductive pads, and the second light emitting diode die may include second anode and cathode contacts respectively coupled to the third and fourth electrically conductive pads using metallic bonds. More particularly, widths of the metallic bonds between the second anode contact and the third pad and between the second cathode contact and the fourth pad may be at least 60 percent of a width of the first light emitting diode die. By providing the metallic bonds having widths of at least 60 percent of the widths of the light emitting diode die, electrical and/or thermal resistance may be reduced for an array of such light emitting diode die on a same packaging substrate.

The first and second light emitting diode die may be asymmetrically mounted between the respective electrically conductive pads. For example, there may be at least a 25 percent difference between a contact area of the metallic bond between the first anode contact and the first pad and a contact area of the metallic bond between the first cathode contact and the second pad. Similarly, there may be at least a 25 percent difference between a contact area of the metallic bond between the second anode contact and the third pad and a contact area of the metallic bond between the second cathode contact and the fourth pad. More particularly, contact areas of cathode contacts may be significantly greater than contact areas of anode contacts.

A combined contact area of the metallic bonds between the first anode contact and the first pad and between the first cathode contact and the second pad may be at least 70 percent of a surface area of the first light emitting diode die, and a combined contact area of the metallic bonds between the second anode contact and the third pad and between the second cathode contact and the fourth pad may be at least 70 percent of a surface area of the second light emitting diode die. By providing relatively large contact/bonding areas, electrical and/or thermal resistance may be reduced.

Depending on a desired serial/parallel configuration for an LED array, the LED die can bridge smaller conductive pads or islands to electrically couple the LED die in series, and LED die can be electrically coupled to larger conductive islands or pads or contiguous conductive pads or islands to electrically couple the LED die in parallel. In some embodiments, intermediate size conductive pads or islands can be used to provide serial and/or parallel electrical connections while more readily providing a desired shape for the LED array. Combinations of smaller, intermediate and larger conductive pads or islands can be used to achieve a serial string of LED die, a parallel configuration of LED die, and/or combinations thereof depending on the desired forward operating voltage (Vf), operating current, desired luminous flux and/or desired luminous efficiency or efficacy. In some embodiments, the first and third electrically conductive pads may comprise different portions of a continuous anode contact pad, and the second and fourth electrically conductive pads may comprise different portions of a continuous cathode contact pad. Accordingly, the first and second light emitting diode die may be electrically coupled in parallel. In an alternative, the second and third electrically conductive pads may comprise different portions of a continuous island contact pad that is separate from the first and fourth electrically conductive pads. Accordingly, the first and second light emitting diode die may be electrically coupled in series.

The first light emitting diode die may include a first diode region including therein a first n-type layer and a first p-type layer, the first anode contact may ohmically contact the first p-type layer, and the first cathode contact may ohmically contact the first n-type layer. The second light emitting diode die may include a second diode region including therein a second n-type layer and a second p-type layer, the second anode contact may ohmically contact the second p-type layer, and the second cathode contact may ohmically contact the second n-type layer. Moreover, a filler may be provided on the packaging substrate between the first and second electrically conductive pads and between the third and fourth electrically conductive pads with the filler being reflective and electrically insulating. The filler may have a thickness that is less than thicknesses of the electrically conductive pads so that a recess remains between the electrically conductive pads. The filler may have a thickness that is the same as thicknesses of the electrically conductive pads so that a substantially planar surface is defined by the electrically conductive pads and the filler therebetween. The filler may have a thickness that is greater than thicknesses of the electrically conductive pads so that the filler extends beyond surfaces of the electrically conductive pads (provided that the filler is not so thick as to interfere with bonding between the LED die and the electrically conductive pads).

According to some other embodiments, an electronic device may include a packaging substrate having a packaging substrate face, and a plurality of light emitting diode die electrically and mechanically coupled to the packaging substrate. More particularly, each of the light emitting diode die may include a diode region, an anode contact, and a cathode contact. The diode region may have first and second opposing faces and may include therein an n-type layer and a p-type layer, with the first face between the second face and the packaging substrate. The anode contact may ohmically contact the p-type layer and may extend on the first face between the first face and the packaging substrate. The cathode contact may ohmically contact the n-type layer and may extend on the first face between the first face and the packaging substrate. In addition, a transparent substrate may be provided on the second face with the diode region between the transparent substrate and the packaging substrate. Moreover, the transparent substrate may have a thickness of at least about 50 micrometers, at least about 100 micrometers, or even at least about 150 micrometers. For example, the transparent substrate may be a crystalline growth substrate (e.g., an SiC growth substrate and/or a sapphire growth substrate) on which the diode region is epitaxially grown, or the transparent substrate may be a bonded substrate provided after removing a growth substrate. The transparent substrate may include an inner face adjacent the second face, an outer face remote from the second face, and oblique sidewalls that extend from the outer face towards the second face. According to some embodiments, the transparent growth substrate may have a thickness in the range of about 175 micrometers to about 350 micrometers.

Moreover, a phosphor layer may be provided on each of the light emitting diode die opposite the packaging substrate so that the transparent substrate of each light emitting diode die is between the phosphor layer and the respective diode region. Accordingly, the diode region of each light emitting diode die may be individually separated from the phosphor layer(s). The transparent layer of each light emitting diode die may improve light extraction from its diode region. In addition, the transparent substrate may improve performance of the phosphor layer by reducing light flux density on the phosphor layer and/or by reducing heating of the phosphor layer.

The plurality of light emitting diode die may be arranged in lines with at least two of the lines including different numbers of light emitting diode die. A lens may extend from the packaging substrate face to surround the plurality of light emitting diode die. Moreover, a first line along an edge of the plurality of light emitting diode die may include fewer of the light emitting diode die than a second line in a central portion of the plurality of light emitting diode die. The light emitting diode die of two adjacent lines may be offset, or the lines may define rows of an array, and the light emitting diode die may be further aligned in columns of the array perpendicular to the rows. Moreover, the light emitting diode die may be arranged in an array with adjacent ones of the light emitting diode die being spaced apart by no more than about 250 micrometers, by no more than about 100 micrometers, or even by no more than about 50 micrometers. The light emitting diode die, for example, may be spaced apart by about 40 micrometers to about 75 micrometers. In some embodiments, reduced spacings between light emitting diode die may be desired to enable high density arrays in small footprint packages and/or to provide improved color uniformity, provided that sufficient space (e.g., greater than about 10 micrometers, greater than about 20 micrometers, or greater than about 50 micrometers) is provided to allow manufacturing placement and/or to reduce light absorption between light emitting diode die. In some embodiments, package size, LED die spacings, and/or other dimensions of the assembly may be driven by manufacturability, targeted performance, targeted package size, etc. Increased LED die spacings may be used to provide improved thermal performance due to increased heat dissipation. According to some embodiments, spacings between LED die may be in the range of about 20 micrometers to about 500 micrometers, in the range of about 40 micrometers to about 150 micrometers, or even in the range of about 50 micrometers to about 100 micrometers.

According to still other embodiments, an electronic device may include a packaging substrate having a packaging substrate face with electrically conductive first and second pads on the packaging substrate face, and an array of light emitting diode die on the packaging substrate face. The array of light emitting diode die may be electrically coupled between the first and second pads, and the array of light emitting diode die may be arranged in lines with at least two of the lines of the array including different numbers of light emitting diode die.

A line of light emitting diode die, for example, may be a row or a column of an array of light emitting diode die. By providing rows/columns of different lengths, central rows/columns of the array may be longer than peripheral rows/columns of the array so that a larger number of light emitting diode die may be included within a given circular perimeter. For example, a first line along an edge of the array may include fewer of the light emitting diode die than a second line in a central portion of the array.

A lens may extend from the packaging substrate face to surround the array of light emitting diode die. By providing lines of light emitting diode die in lines of different lengths, a larger number of light emitting diode die may be included within a perimeter of the lens.

Each of the light emitting diode die may include a diode region, an anode contact, and a cathode contact. The diode region may have first and second opposing faces and may include therein an n-type layer and a p-type layer with the first face between the second face and the packaging substrate. The anode contact may ohmically contact the p-type layer and may extend on the first face between the first face and the packaging substrate. The cathode contact may ohmically contact the n-type layer and may extend on the first face between the first face and the packaging substrate. Moreover, each of the anode contacts of each of the light emitting diode die may be electrically and mechanically bonded to the first pad, and each of the cathode contacts of each of the light emitting diode die may be electrically and mechanically bonded to the second pad. Accordingly, the light emitting diode die may be electrically coupled in parallel between the first and second pads. Moreover, the first and second pads may be first and second interdigitated pads. Stated in other words, at least one of the first and second pads may define a finger extending between opposing portions of the other of the first and second pads.

The packaging substrate may include a plurality of electrically conductive island pads between the first and second pads. Each of the light emitting diode die may include a diode region, an anode contact, and a cathode contact. The diode region may have first and second opposing faces and may include therein an n-type layer and a p-type layer with the first face between the second face and the packaging substrate. The anode contact may ohmically contact the p-type layer and may extend on the first face between the first face and the packaging substrate. The cathode contact may ohmically contact the n-type layer and may extend on the first face between the first face and the packaging substrate. The light emitting diode die may be electrically coupled in series through the island pads and through the anode and cathode contacts between the first and second pads. More particularly, each of the island pads may be electrically and mechanically bonded to an anode contact of a respective first one of the light emitting diode die and to a cathode contact of a respective second one of the light emitting diode die.

The light emitting diode die of two adjacent lines of the array may be offset. In an alternative, the lines may define rows of the array, and the light emitting diode die may be aligned in columns perpendicular to the rows. Moreover, adjacent ones of the light emitting diode die may be spaced apart by no more than about 250 micrometers, no more than about 100 micrometers, or even no more than about 50 micrometers. The light emitting diode die, for example, may be spaced apart by about 40 micrometers to about 75 micrometers. Generally, smaller spacings between light emitting diode die may be desired, provided that sufficient space (e.g., greater than about 10 micrometers, or greater than about 20 micrometers) is provided to allow manufacturing placement and/or to reduce light absorption between light emitting diode die. According to some embodiments, spacings between LED die may be in the range of about 20 micrometers to about 500 micrometers, in the range of about 40 micrometers to about 150 micrometers, or even in the range of about 50 micrometers to about 100 micrometers.

According to yet other embodiments, an electronic device may include a packaging substrate including first and second electrically conductive pads on a face of the packaging substrate, and a reflective and electrically insulating filler between the first and second electrically conductive pads. A light emitting diode die may include a diode region, an anode contact, and a cathode contact. The diode region may have first and second opposing faces and may include therein an n-type layer and a p-type layer. The anode contact may ohmically contact the p-type layer and may extend on the first face, and the anode contact may be electrically and mechanically bonded to the first electrically conductive pad of the packaging substrate. The cathode contact may ohmically contact the n-type layer and may also extend on the first face, and the cathode contact may be electrically and mechanically bonded to the second electrically conductive pad of the packaging substrate. The filler, for example, may include a white solder mask, and/or a low modulus material (silicone, gel, etc.) loaded with particles of a reflective materials such as $TiO_2$.

A transparent substrate may be provided, on the second face with the diode region between the transparent substrate and the packaging substrate, and the transparent substrate may have a thickness of at least about 50 micrometers, at least about 100 micrometers, or even at least about 150 micrometers. According to some embodiments, the transparent growth substrate may have a thickness in the range of about 175 micrometers to about 350 micrometers. Moreover, a phosphor layer may be provided on the transparent substrate opposite the packaging substrate so that the transparent substrate is between the phosphor layer and the diode region. According to some embodiments, the transparent substrate may be an SiC growth substrate or a sapphire growth substrate. According to some other embodiments, the transparent substrate may be a bonded substrate that is provided after removing the growth substrate.

The light emitting diode die may be a first light emitting diode die, the diode region may be a first diode region, the anode contact may be a first anode contact, and the cathode contact may be a first cathode contact. In addition, a second light emitting diode die may include a second diode region, a second anode contact, and a second cathode contact. The second diode region may have first and second opposing faces and may include therein an n-type layer and a p-type layer. The second anode contact may ohmically contact the p-type layer and may extend on the first face, with the second anode contact being electrically and mechanically bonded to the first electrically conductive pad of the packaging substrate. The second cathode contact may ohmically contact the n-type layer and may also extend on the first face with the second cathode contact being electrically and mechanically bonded to the second electrically conductive pad of the packaging substrate. Accordingly, the first and second light emitting diode die may be electrically coupled in parallel. The first and second light emitting diode die may be spaced apart by no more than about 250 micrometers, no more than about 100 micrometers, or no more than about 50 micrometers. The light emitting diode die, for example, may be spaced apart by about 40 micrometers to about 75 micrometers. Generally, smaller spacings between light emitting diode die may be desired, provided that sufficient space (e.g., greater than about 10 micrometers, or greater than about 20 micrometers) is provided to allow manufacturing placement and/or to reduce light absorption between light emitting diode die.

The light emitting diode die may be a first light emitting diode die, the diode region may be a first diode region, the anode contact may be a first anode contact, and the cathode contact may be a first cathode contact. In addition, the packaging substrate may include a third electrically conductive pad, and the filler may surround the second electrically conductive pad. A second light emitting diode die may include a second diode region, a second anode contact, and a second cathode contact. The second diode region may have first and second opposing faces and may include therein an n-type layer and a p-type layer. The second anode contact may ohmically contact the p-type layer and may extend on the first face, and the second anode contact may be electrically and mechanically bonded to the second electrically conductive pad of the packaging substrate. The second cathode contact may ohmically contact the n-type layer and may also extend on the first face, and the second cathode contact may be electrically and mechanically bonded to the third electrically conductive pad of the packaging substrate. Accordingly, the first and second light emitting diode die may be electrically coupled in series.

The first and second light emitting diode die may be spaced apart by no more than about 250 micrometers, by no more than about 100 micrometers, or by no more than about 50 micrometers. The light emitting diode die, for example, may be spaced apart by about 40 micrometers to about 75 micrometers. Generally, smaller spacings between light emitting diode die may be desired, provided that sufficient space (e.g., greater than about 10 micrometers, or greater than about 20 micrometers) is provided to allow manufacturing placement and/or to reduce light absorption between light emitting diode die. Moreover, the filler material and the packaging substrate may comprise different materials.

According to more embodiments, an electronic device may include a packaging substrate having a packaging substrate face, and a plurality of light emitting diode die electrically and mechanically coupled to the packaging substrate. Each of the light emitting diode die may include a diode region, an anode contact, and a cathode contact. Each diode region may have first and second opposing faces and may include therein an n-type layer and a p-type layer with the first face between the second face and the packaging substrate. Each anode contact may ohmically contact the p-type layer and may extend on the first face between the first face and the packaging substrate. Each cathode contact may ohmically contact the n-type layer and may extend on the first face between the first face and the packaging substrate. A phosphor layer may be provided on each of the light emitting diode die opposite the packaging substrate with portions of the diode region of each of the light emitting diode die being separated from the phosphor layer by a distance of at least about 50 micrometers.

Each of the light emitting diode die may further include a transparent substrate on the second face between the second face and the phosphor layer. The transparent substrate may include an inner face adjacent the second face, an outer face remote from the second face, and sidewalls that extend from the outer face towards the second face. The transparent substrate, for example, may be an SiC growth substrate or a sapphire growth substrate, or the transparent substrate may be a bonded substrate that is provided after removing the growth substrate. According to some embodiments, the transparent substrate may have a thickness in the range of about 175 micrometers to about 350 micrometers.

The phosphor layer may be a continuous phosphor layer extending across each of the plurality of light emitting diode die and across portions of the packaging substrate between the light emitting diode die. Moreover, a thickness of the continuous phosphor layer may be less than a thickness of one of the light emitting diode die, or a thickness of the continuous phosphor layer may be greater than a thickness of one of the light emitting diode die. In an alternative, the phosphor layer may include a plurality of separate phosphor layers with each of the separate phosphor layers being on a respective one of the light emitting diode die.

BRIEF DESCRIPTION OF THE DRAWINGS

FIGS. 7A and 7B are respective plan and cross-sectional views of an array of packaged LED die electrically coupled in parallel on a submount according to various embodiments described herein.

FIGS. 9A and 9B are respective plan and cross-sectional views of an array of radially arranged LED die electrically coupled in parallel on a submount according to various embodiments described herein.

FIGS. 10A and 10B are respective plan and cross-sectional views of an array of packaged LED die electrically coupled in parallel on a submount including interdigitated electrodes according to various embodiments described herein.

FIG. 14A is a plan view of a submount including cathode, island, and anode pads for an array of LED die according to various embodiments described herein.

FIG. 14B is a plan view of an array of LED die electrically coupled in series on the submount of FIG. 14A.

FIG. 14C is a cross-sectional view of a column of LED die from the array of FIG. 14B.

FIG. 17A is a plan view of a submount including cathode, island, and anode pads for an array of LED die according to various embodiments described herein.

FIG. 17B is a plan view of an array of LED die with aligned rows and columns electrically coupled in series on the submount of FIG. 17A.

FIG. 22A is a photograph of a submount including electrically conductive pads for an array of serially connected LED die according to various embodiments described herein, and FIGS. 22B, 22C, and 22D are photographs of LED assemblies including the submount of FIG. 22A.

DETAILED DESCRIPTION

Figure 1:
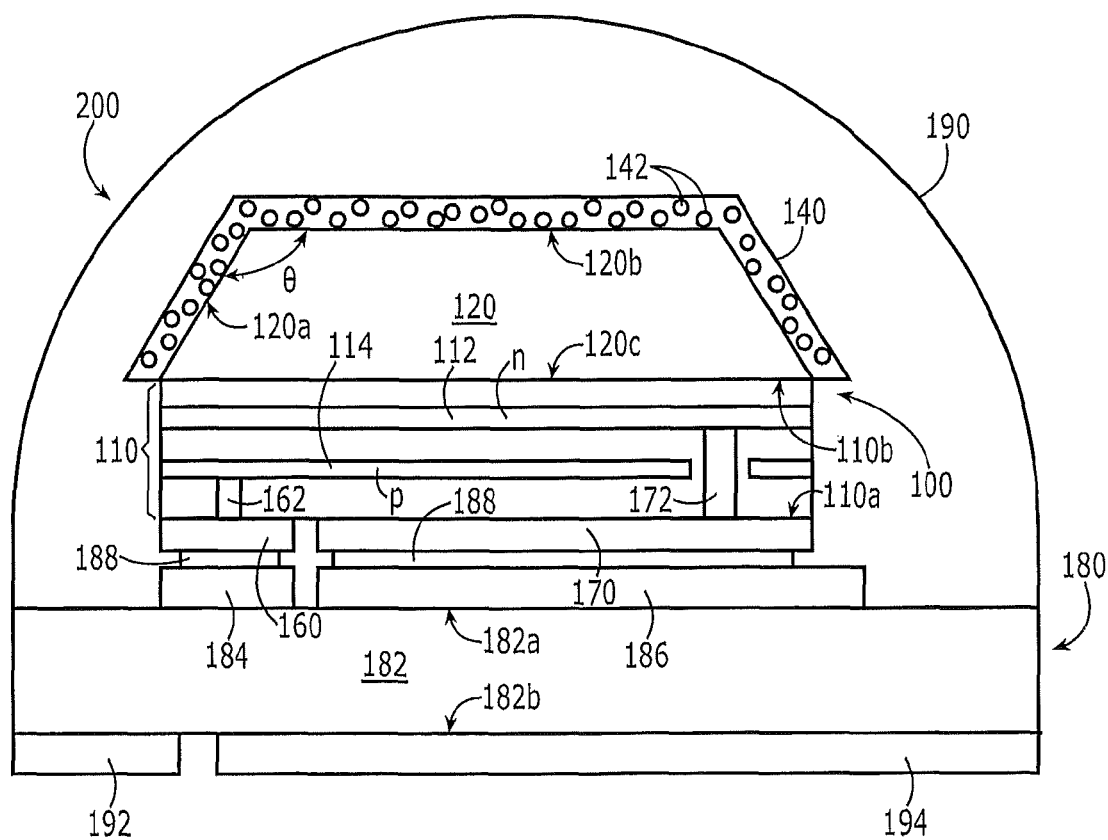
FIGS. 1 and 2 are cross-sectional views of LEDs and packaged LEDs according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" when at least 90% of the radiation from the LED that impinges on the transparent layer or region emerges through the transparent region. For example, in the context of blue and/or green LEDs that are fabricated from gallium nitride-based materials, silicon dioxide can provide a transparent insulating layer (for example, at least 90% transparent), whereas indium tin oxide (ITO) can provide a transparent conductive layer (for example, at least 90% transparent) as measured by considering transmitted and reflected components on a sapphire substrate. Moreover, as used herein, a layer or region of an LED is considered to be "reflective" when at least 90% of the angle averaged radiation that impinges on the reflective layer or region from the LED is reflected back into the LED. For example, in the context of gallium nitride-based blue and/or green LEDs, silver (for example, at least 90% reflective) may be considered reflective materials. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

It is known to provide a conformal phosphor layer on an oblique or tapered sidewall of a light emitting diode, as described in U.S. Pat. No. 6,853,010, to Slater, Jr. et al., entitled Phosphor-Coated Light Emitting Diodes Including Tapered Sidewalls, and Fabrication Methods Therefor, assigned to the assignee of the present application, the entire disclosure of which is hereby incorporated by reference herein as if set forth fully herein (hereinafter referred to as "the '010 Patent"). As described in the '010 Patent, the tapered or oblique sidewall can allow at least some of the emitting surfaces of a light emitting diode (LED) to be covered with a nearly conformal phosphor-containing layer of substantially uniform thickness. This more conformal coverage can produce a desired spectrum of light, while also allowing more radiant flux to be emitted from the phosphor-coated LED. Phosphor layers are further discussed detail in U.S. application Ser. No. 13/018,013 to Donofrio et al., entitled Horizontal Light Emitting Diodes Including Phosphor Particles, and in U.S. application Ser. No. 13/017,845 to Donofrio et al., entitled Conformally Coated Light Emitting Devices And Methods For Providing The Same, both filed Jan. 31, 2011, and assigned to the assignee of the present application. The disclosures of both of the above referenced applications are hereby incorporated herein by reference in their entireties as if set forth fully herein.

Various embodiments described herein may arise from recognition that a conformal phosphor layer on an oblique sidewall of an LED may provide further unanticipated advantages. Specifically, larger particle size phosphor particles may be used in the conformal layer that comprises phosphor. It is well known that larger phosphor particles are generally more efficient in light conversion than small sized phosphor particles. Unfortunately, due to their large size, large phosphor particles may also have a lower light scattering efficiency than relatively small phosphor particles. The low scattering efficiency may produce a high angular variation in Correlated Color Temperature (CCT), which is typical in white LEDs using large particulate size phosphor particles for brightness boost.

In sharp contrast, various embodiments described herein may provide relatively high brightness with relatively low angular variation, by providing a conformal layer that comprises large phosphor particles on the outer face and on the oblique sidewall of an LED.

It will be understood that real world phosphor particle layers are not precisely uniform in size. Rather, consistent with other particulate materials, a range of particle sizes may be provided, and various metrics are used to indicate a measure of particle size in a particulate material. Particle size is generally measured by an equivalent particle diameter, which may take into account the fact that the particles may be non-spherical. Moreover, the particle size distribution may be specified by providing one or more equivalent particle diameters, often abbreviated with "d", to indicate a mass percent of the particles that has a smaller diameter. Thus, d50, also referred to as an average equivalent particle diameter, indicates that 50 mass-% of the particles has a smaller diameter. Moreover, an equivalent particle diameter d10 refers to 10 mass-% of the particles having a smaller diameter, whereas an equivalent particle diameter d90 refers to 90 mass-% of the particles having a smaller diameter. A given phosphor may be specified in terms of d50, dl 0 and/or d90. Moreover, other metrics other than d50, d10 and d90 may be used, such as d75 and d25. Combinations of these metrics also may be used.

FIG. 1 is a cross-sectional view of a light emitting diode (also referred to as a light emitting diode "die" or "chip") and a packaged light emitting diode according to various embodiments described herein. Referring to FIG. 1, these light emitting diodes 100 include a diode region 110 having first and second opposing faces 110*a*, 110*b*, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on a first face 110*a*. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110*a*. The cathode contact may directly ohmically contact the n-type layer 112, or may ohmically contact the n-type layer 112 by way of one or more conductive vias 172 and/or other intermediate layers. As illustrated in FIG. 1, the anode contact 160 and the cathode contact 170 that both extend on the first face 110*a* are coplanar. The diode region 110 also may be referred to herein as an "LED epi region", because it is typically formed epitaxially on a substrate 120. For example, a Group III-nitride based LED ep±110 may be formed on a silicon carbide growth substrate. In some embodiments, as will be described below, the growth substrate may be present in the finished product. In other embodiments, the growth substrate may be removed. In still other embodiments, another substrate may be provided that is different from the growth substrate, and the other substrate may be bonded to the LED after removing the growth substrate.

As also shown in FIG. 1, a transparent substrate 120, such as a transparent silicon carbide growth substrate or a transparent sapphire growth substrate, is included on the second face 110*b* of the diode region 110. The transparent substrate 120 includes a sidewall 120*a* and may also include an inner face 120*c* adjacent the second face 110*b* of the diode region 110 and an outer face 120*b*, remote from the inner face 120*c*. The outer face 120*b* is of smaller area than the inner face 120*c*. In some embodiments, the sidewall 120*a* may be stepped, beveled and/or faceted, so as to provide the outer face 120*b* that is of smaller area than the inner face 120*c*. In other embodiments, as shown in FIG. 1, the sidewall is an oblique sidewall 120*a* that extends at an oblique angle θ, and in some embodiments at an obtuse angle, from the outer face 120*b* towards the inner face 120*c*. According to some embodiments, transparent substrate 120 may have a thickness of at least about 50 micrometers, at least about 100 micrometers, or even at least about 150 micrometers. Transparent substrate 120, for example, may have a thickness in the range of about 150 micrometers to about 400 micrometers, or in the range of about 175 micrometers to about 350 micrometers. Phosphor layer 140 may thus be separated from portions of diode region 110 by a thickness of transparent substrate 120.

LEDs 100 configured as was described above in connection with FIG. 1, may be referred to as "horizontal" or "lateral" LEDs, because both the anode and the cathode contacts thereof are provided on a single face of the LED. Horizontal LEDs may be contrasted with vertical LEDs in which the anode and cathode contacts are provided on opposite faces thereof, as is illustrated, for example, in the '010 Patent.

Various other configurations of horizontal LEDs that may be used according to any of the embodiments described herein, are described in detail in U.S. Patent Application publication 2009/0283787 to Donofrio et al., entitled Semiconductor Light Emitting Diodes Having Reflective Structures and Methods of Fabricating Same, assigned to the assignee of the present application, the disclosure of which is hereby incorporated herein by reference in its entirety as if set forth fully herein (hereinafter referred to as "the '787 Publication").

Still continuing with the description of FIG. 1, a conformal layer 140 that comprises phosphor particles 142 having an average equivalent particle diameter d50 of at least 10 μm, is provided on the outer face 120b and on the oblique sidewall 120a. In embodiments of FIG. 1, the entire outer face 120b and the entire oblique sidewall 120a are covered with the phosphor layer 140. However, in other embodiments, the entire outer face 120b and/or the entire oblique sidewall 120a need not be covered with the phosphor layer 140. Moreover, the conformal phosphor layer 140 may be of uniform thickness on the outer face 120b and on the oblique sidewall 120a. In some embodiments, this uniform thickness is between the range of between about 36 μm and about 56 μm and, in other embodiments, a range of between about 30 μm and about 75 μm may be provided. In other embodiments, a thickness of about 46 μm may be provided.

Various embodiments of phosphor layers 140 and diode regions 110 may be provided according to various embodiments described herein. For example, in some embodiments, the diode region 110 is configured to emit blue light, for example light having a dominant wavelength of about 450-460 nm, and the conformal layer comprises yellow phosphor, such as YAG:Ce phosphor having a peak wavelength of about 550 nm and an average equivalent particle diameter d50 of at least 10 μm. In other embodiments, an average equivalent diameter d50 of at least about 15 μm is provided. In still other embodiments, an average equivalent diameter d50 of between about 15 μm and about 17 μm is provided.

In other embodiments, the diode region 110 is configured to emit blue light upon energization thereof, as described above, and the conformal layer 140 may comprise a mixture of phosphor having average equivalent particle diameter of at least about 10 μm, as described above, and red phosphor, such as a CASN-based phosphor, having an average equivalent particle diameter d50 of about 10 μm in size. In still other embodiments, the mixture of yellow phosphor and red phosphor may have a phosphor weight ratio of the yellow phosphor to the red phosphor of at least about 5:1 and, in other embodiments, at least about 9:1. In some embodiments, since at least five times as much yellow phosphor as red phosphor is provided, a wider range of red phosphor particle sizes may be used in combination with yellow phosphor particles having an average equivalent particle diameter d50 of at least about 10 μm.

As was described above, various embodiments of FIG. 1 may arise from recognition that a conformal phosphor layer 140 on an oblique sidewall 120a of an LED 100 may provide further unanticipated advantages. Specifically, large particle size phosphor particles 142 may be used in the conformal layer 140 that comprises phosphor. It is well known that larger phosphor particles 142 are generally more efficient in light conversion than small sized phosphor particles. Unfortunately, due to their large size, large phosphor particles 142 may also have a lower light scattering efficiency than relatively small phosphor particles. The low scattering efficiency may produce a high angular variation in CCT, which is typical in white LEDs using large particulate size phosphor particles for brightness boost.

In sharp contrast, various embodiments described herein may provide relatively high brightness with relatively low angular variation, by providing a conformal layer 140 that comprises large phosphor particles 142 on the outer face 120b and on the oblique sidewall 120a of an LED.

Moreover, various embodiments described herein may provide other unexpected advantages. Specifically, since the CCT variation can be reduced compared to an LED with a non-oblique sidewall, less red phosphor may need to be used. For example, with non-oblique walls, a ratio of yellow phosphor to red phosphor may be about 2:1 whereas, as described above, ratios of at least about 5:1 or at least about 9:1 may be used. Since red phosphor often is more expensive than yellow phosphor, lower cost LEDs may be obtained. Moreover, since a higher ratio of yellow phosphor to red phosphor may be used, the particle size of the red phosphor may vary over a wide range because the particle size of the yellow phosphor will dominate.

Continuing with the description of FIG. 1, the LED 100 may be combined with a packaging substrate, such as a submount 180, and a lens 190 to provide a packaged LED 200. The submount 180 may include a body 182 that may comprise aluminum nitride (AlN). In other embodiments, metal core substrates, printed circuit boards, lead frames and/or other conventional packaging substrates may be used to mount the LED 100 in a flip-chip configuration. The submount 180 includes a submount face 182a, and an anode pad 184 and a cathode pad 186 thereon. The anode and cathode pads may comprise silver-plated copper and/or other conductive materials. As illustrated in FIG. 1, the LED 100 is mounted on the submount 180, such that the first face 110a is adjacent the submount face 182a, the outer face 110b is remote from the submount 180, the anode contact 184 is adjacent the anode pad 160, and the cathode contact 186 is adjacent the cathode pad 170. In some embodiments, a bonding layer, such as a eutectic gold/tin solder layer 188, is used to electrically, thermally and mechanically connect the anode contact 160 to the anode pad 184, and the cathode contact 170 to the cathode pad 186. In other embodiments, direct attachment of the anode contact 160 to the anode pad 184, and direct attachment of the cathode contact 170 to the cathode pad 186 may be provided, for example using thermocompression bonding and/or other techniques.

A packaged device anode 192 and a packaged device cathode 194 may be provided on a second face 182b of the submount body 182, and may be connected to the anode pad 184 and cathode pad 186, respectively, using internal vias and/or conductive layers that extend on and/or around the submount body 182.

Various embodiments of submounts 180 that may be used with embodiments described herein, are described in the '787 Publication that was cited above. Various other embodiments of submounts 180 are described in U.S. Patent Application Publication 2009/0108281 to Keller et al., entitled Light Emitting Diode Package and Method for Fabricating Same, assigned to the assignee of the present application, the disclosure of which is hereby incorporated herein by reference in its entirety as if set forth fully herein (hereinafter referred to as "the '281 Publication"). It will be understood that any and all embodiments of these submounts may be used in embodiments of FIG. 1. However, the pad structure on the submount may be modified so as to be used with a horizontal LED 100 of FIG. 1, rather than the vertical LEDs described in the '281 Publication.

Finally, the packaged LED 200 may also include a lens 190 that extends from submount face 182a to surround the LED 100. The lens 190 may be a molded plastic lens, as described in detail in the '281 Publication, and may be fabricated on the submount according to techniques that are described in the '281 Publication, and/or other techniques. In some embodiments, the lens may be about 3.06 mm in diameter.

Figure 2:
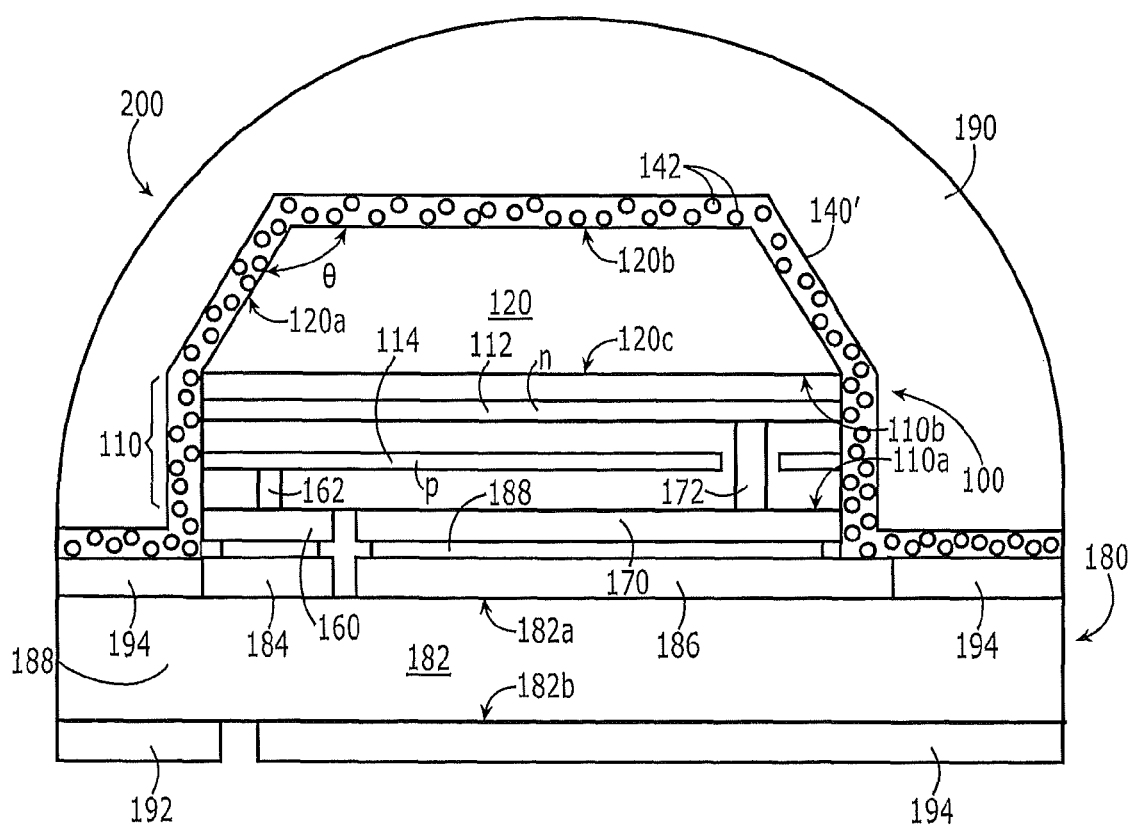

FIG. 2 is a cross-sectional view of LEDs and packaged LEDs according to various other embodiments. Compared to embodiments of FIG. 1, the phosphor layer 140' extends across the diode region 110 and/or on the first face 182a of the submount body 182. The phosphor layer may be fabricated to extend onto the submount as is described in the '281 Publication. Moreover, as shown in FIG. 2, the submount 180 may include a layer 194 on the first face 182a thereof. The layer 194 may be an extension of the anode pad 184 and the cathode pad 186 or may be distinct therefrom. In some embodiments, the layer 194 is a reflective layer that extends between the submount face 182a and the conformal layer 140' that includes phosphor that extends on the submount face 182a. This reflective layer 194 can reflect light that passes through the phosphor layer that is on the submount face 182a back toward the lens 190, and can thereby increase efficiency of the LED.

Packaged LEDs as described above in connection with FIGS. 1 and 2 may be embodied as a Cree® XLamp® XP-E High-Efficiency White (HEW) LED, as described, for example, in the Cree® XLamp® XP-E High-Efficiency White LEDs Data Sheet, Publication No. CLD-DS34, Rev. 0, dated Dec. 6, 2010, and available at cree.com/products/xlamp_xpe.asp, the disclosure of which is hereby incorporated herein by reference in its entirety as if set forth fully herein.

Figure 3C:
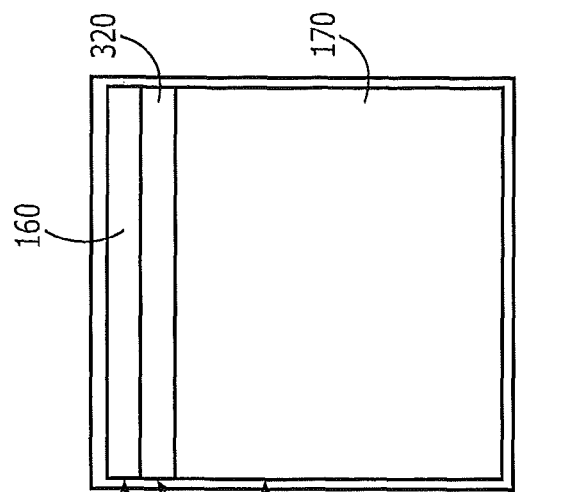
FIGS. 3A, 3B, and 3C are a top view, a cross-sectional view, and a bottom view, respectively, of an LED according to embodiments of FIG. 1 or 2.
Figure 3B:
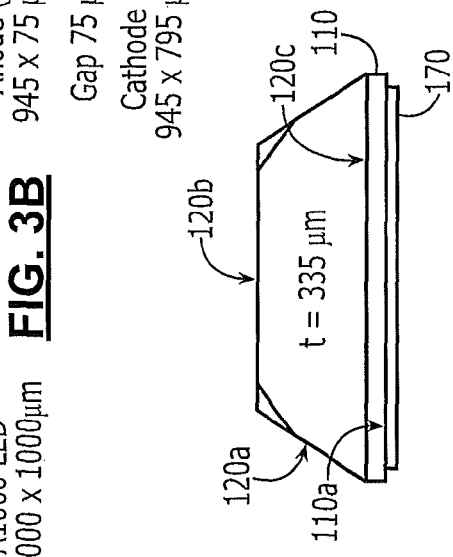
Figure 3A:
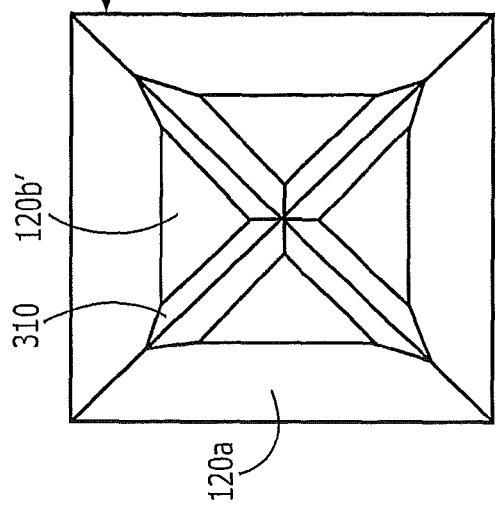

FIGS. 3A, 3B and 3C are a top view, a cross-section and a bottom view, respectively, of an LED 100 of FIG. 1 or 2. The phosphor layer 140/140' is not illustrated.

In FIGS. 1 and 2, the outer face 120b was planar. However, in embodiments of FIG. 3A, the outer face 120b' includes at least one groove, such as an X-shaped groove 310 therein. Multiple X-shaped grooves and/or other shaped grooves may also be provided. Moreover, as shown in FIG. 3C, in some embodiments, the anode contact 160 and the cathode contact 170 may collectively occupy at least about 90% of the active diode region area.

Specifically, FIGS. 3A-3C illustrate an embodiment wherein the inner face 120c of the substrate 120 is a square inner face 120c having sides that are about 1,000 µm long, the outer face 120b' is a square outer face having sides that are about 642+µm long, and a thickness or distance t between the square inner and outer faces (also referred to as "height") is about 335 µm, so as to define an area ratio between the outer face 120b and the inner face 120c of about 0.41. The diode region 110 may also be a square, having sides that are about 1,000 µm long. A small gap 320 of about 75 µm (micrometers) is provided. A calculation of the active attach area may be made as follows:

Total active area of diode region=751,275 µm²(cathode)+70,875 µm²(gap)+70,875 µm²(anode)= 893,025 µm².

Total active attach area=751,275 µm²(cathode)+70,875 µm²(anode)=822,150 µm².

Thus, the active attach area is at least about 90% of the active diode region area.

According to some embodiments, a total attach area (i.e., a combined surface area of anode contact 160 and cathode contact 170) may be greater than 70% of a total surface area of face 110a of the LED, greater than 80% of the total surface area of face 110a, or even greater than 90% of the total surface area of face 110a. As shown in FIGS. 3A to 3C, for example, face 110a of the LED may have a surface area of 1×10⁶ µm², anode contact 160 may have a contact surface area of 70,875 µm², and cathode contact 170 may have a contact surface area of 751,275 µm². Accordingly, anode contact 160 and cathode contact 170 may collectively occupy about 82% of the surface area of face 110a of the LED.

Surface areas of anode and cathode contacts 160 and 170 may be asymmetric, with cathode 170 accounting for at least 70% of the combined contact area, at least 80% of the combined contact area, or even at least 90% of the combined contact area. As shown in FIGS. 3A to 3C, for example, cathode contact 170 may occupy about 91% of the total contact area (i.e., 100%×751,275 µm²/(751,275 µm²+70,875 µm²)) or about 75% of the surface area of face 110a (i.e., 100%×751,275 µm²/(1×10⁶ µm²)) of the LED. As further shown in FIGS. 3A to 3C, for example, anode contact 160 may occupy about 9% of the total contact area (i.e., 100%×70,875 µm²/(751,275 µm²+70,875 µm²)), or about 7% of the surface area of face 110a (i.e., 100%×70,875 µm²/1×10⁶ µm²) of the LED. Accordingly, LED 100 may asymmetrically bridge anode and cathode pads 184 and 186 of submount 180 as shown in FIGS. 1 and 2.

As further shown in FIGS. 3A to 3C, widths of anode and cathode contacts 160 and 170 may be at least 60% of a width of face 110a of the LED, at least 70% of a width of face 110a of the LED, or even at least 90% of a width of face 110a of the LED. For example, each of anode and cathode contacts 160 and 170 may have a width of about 945 µm, and LED face 110A may have a width of 1,000 µm (taken in a same direction as the widths of anode and cathode contacts 160 and 170). Accordingly, each of anode and cathode contacts 160 and 170 of FIG. 3C may have a width that is about 95% of a width of LED face 110a.

Table 1 illustrates various configuration geometries of the substrate 120 that may be provided according to various other embodiments. It will be understood that the "area ratios" used herein are based on the dimensions of the sides of the faces and do not include any added surface area due to texturing, grooves and/or other light extraction features.

TABLE 1

| Designator | Base (Inner) Area, µm² | Top (Outer) Area, µm² | Area Ratio (Top/Base) | Aspect Ratio (Height/Base) |
|---|---|---|---|---|
| DA1000 | 1,000,000 | 412,164 | 0.412164 | 0.335 |
| DA850 | 722,500 | 242,064 | 0.335036678 | 0.394 |
| DA700 | 490,000 | 116,964 | 0.238702041 | 0.5 |

Figure 4:
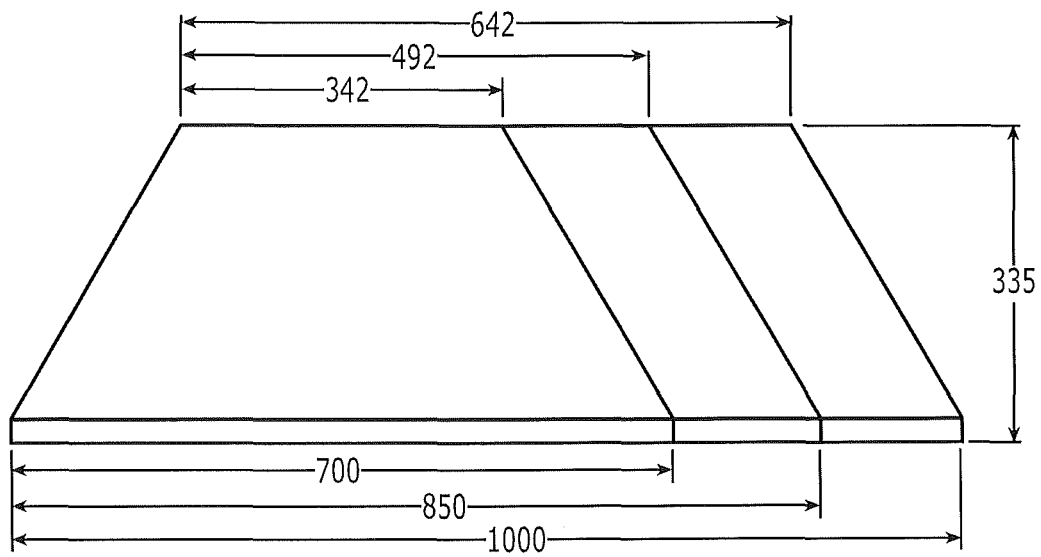
FIGS. 4 and 5 illustrate geometries of substrates of FIGS. 1-3, according to various embodiments described herein.

FIG. 4 illustrates these embodiments. Specifically, the top row of Table 1 illustrates various embodiments wherein the inner face 120c is a square inner face having sides that are about 1,000 μm (micrometer) long (total area 1,000,000 μm$^2$), the outer face 120b is a square outer face having sides that are about 642 μm long (total area 412,164 μm$^2$) and a distance (height) between the square inner and outer faces is about 335 μm so as to define an area ratio of the outer face to the inner face (top to base) of about 0.41, and an aspect ratio of height to a side of the inner face (base) of about 0.335. These embodiments are also illustrated in FIG. 3B. The second row of Table 1 illustrates embodiments wherein the inner face 120c is a square inner face having sides that are about 850 μm long (total area 722,500 μm$^2$), the outer face 120b is a square outer face having sides that are about 492 μm long (total area 242,064 μm$^2$) and a distance (height) between the square inner and outer faces is about 335 μm so as to define an area ratio of the outer face to the inner face of about 0.33 and an aspect ratio of height to base of about 0.39. Finally, the third row of Table 1 illustrates various embodiments wherein the inner face 120c is a square inner face having sides that are about 700 μm long (total area about 722,500 μm$^2$), the outer face 120b is a square outer face having sides that are about 342 μm long (total area about 116,964 μm$^2$) and a distance height between the square inner and outer faces is about 335 μm so as to define an area ratio of the outer face to the inner face of about 0.24 and an aspect ratio of height to base of about 0.5.

Figure 5:
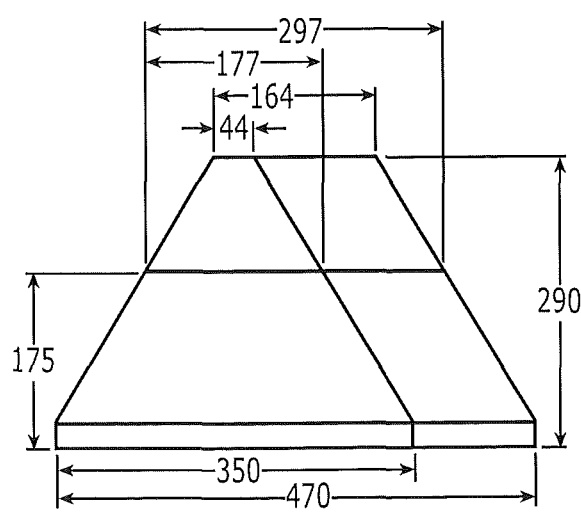

FIG. 5 and Table 2 illustrate other embodiments wherein the inner face 120c is a rectangular inner face of size 350 μm×470 μm. In the first line of Table 2, the height is about 175 μm thick, and the outer face 120b is a rectangle of size 177 μm×297 μm, so as to provide a base (inner) area of 164,500 μm$^2$ and a top (outer) area of 52,569 μm. 52,569 μm$^2$. The area ratio of top to base is about 0.32, and the ratio of height to base is about 0.5. The second line of Table 2 illustrates a thicker height of about 290 μm, so that the top has sides of about 44 μm×164 μm, leading to an area ratio of about 0.044 and a ratio of height to base of about 0.8.

TABLE 2

| Designator | Base (Inner) Area, μm$^2$ | Top (Outer) Area, μm$^2$ | Area Ratio (Top/Base) | Aspect Ratio (Height/Base) |
|---|---|---|---|---|
| DA350—Standard 175 μm thick | 164,500 | 52,569 | 0.319568389 | 0.5 |
| DA350 Extreme—290 μm thick | 164,500 | 7,216 | 0.043866261 | 0.828 |

Accordingly, embodiments of Table 1 and Table 2, corresponding to FIGS. 4 and 5, can provide light emitting diodes wherein an area ratio of the outer face to the inner face is less than or about 0.4 and, in some of these embodiments, the aspect ratio of the height to a side of the inner face is at least about 0.3. These tables and figures also illustrate other embodiments wherein the area ratio of the outer face to the inner face is less than or about 0.33 and, in some embodiments, the aspect ratio of the height to a side of the inner face is at least about 0.4. These tables and figures also illustrate yet other embodiments wherein the area ratio of the outer face to the inner face is less than or about 0.04 and, in some embodiments, the height to base aspect ratio is at least about 0.8.

It has been found that light extraction may be improved as the ratio of the outer area to the inner area is reduced. The larger area devices, such as the DA1000 described on the first line of Table 1 can provide additional extraction by providing a groove, as was illustrated in FIG. 3A. This would appear to indicate that further extraction benefit would be obtained by a further reduction in the ratio of the top to base, but this may be expensive due to the blade width that may be needed for beveling the sidewalls. On the smaller devices, such as the DA350 described in the first row of Table 2, there may be no further gain at blue light in further increasing the ratio, so that an aspect ratio of about 0.32 may already be sufficient for maximum blue extraction.

Lateral LED configurations as were described in Tables 1 and 2 can allow for very low ratios of top to base (outer to inner surfaces of the substrate) compared to previous generation vertical chips, since the backside (top) contact area need not be considered for the electrical performance of the device. Moreover, improved light extraction of these devices may also be a factor in conversion efficiency, since the phosphor layers can scatter light back into the chips.

Figure 6A:
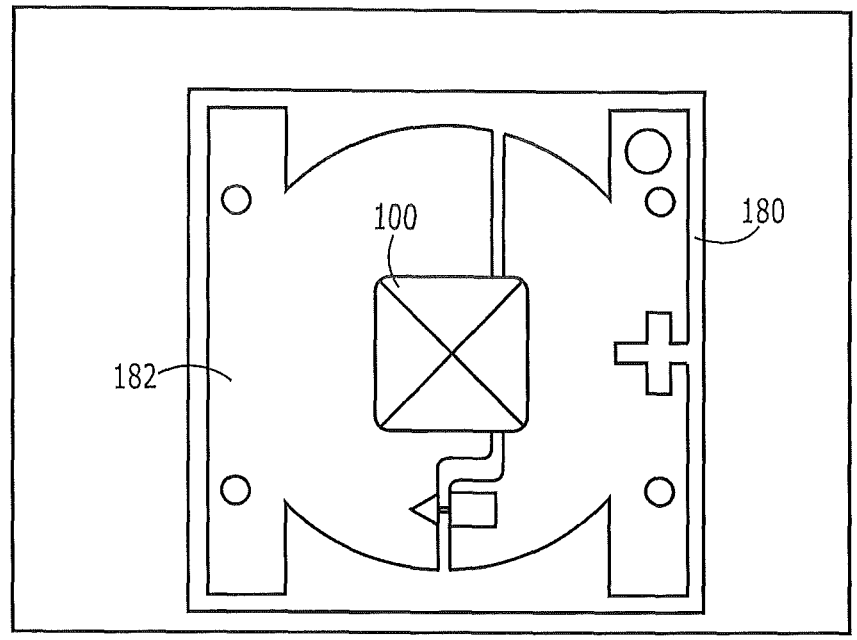
FIG. 6A is a photograph of a submount with an LED mounted thereon according to various embodiments of FIGS. 1-4.
Figure 6B:
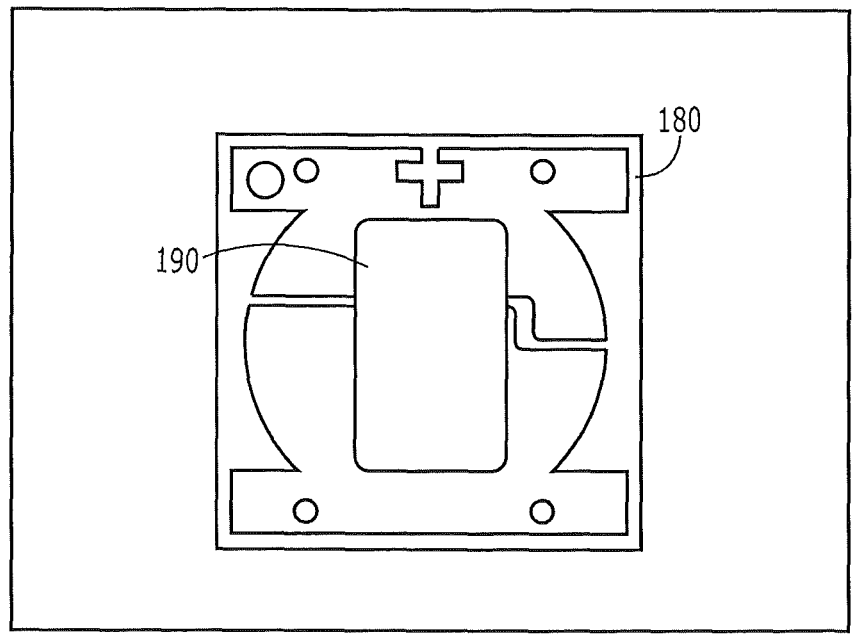
FIG. 6B is a photograph of a packaged LED according to various embodiments of FIGS. 1-4.

FIG. 6A is a photograph of a submount 180 with an LED 100 mounted thereon, as was described in connection with FIGS. 1-4. FIG. 6B is a photograph of a packaged LED 200 of FIGS. 1-4 including lens 190.

Various embodiments that were illustrated in FIGS. 1-6 may also be regarded as illustrating a light emitting diode 100 that comprises a diode region 110 having first and second opposing faces 110a, 110b and including therein an n-type layer 112 and a p-type layer 114. An anode contact 160 ohmically contacts the p-type layer and extends on the first face 110a. A cathode contact 170 ohmically contacts the n-type layer 112 and also extends on the first face 110a. A transparent substrate 120 is provided on the second face 110b. The transparent substrate includes an inner face 120c adjacent the second face 110b, an outer face 120b remote from the second face that is of smaller area than the inner face 120c, and a sidewall 120a that extends from the outer face to the inner face. An area ratio of the outer face to the inner face is less than or about 0.4. In some embodiments, the sidewall is a stepped sidewall. In other embodiments, the sidewall comprises an oblique sidewall that extends at an oblique angle from the outer face towards the inner face. A conformal layer 140, 140' that comprises phosphor 142 having an average equivalent particle diameter d50 of at least about 10 μm is provided on the outer face 120b and on the sidewall 120a.

FIGS. 1-6 may also be regarded as describing other embodiments of a packaged light emitting diode die 200 that includes a light emitting diode die including a diode region, an anode contact and a cathode contact, as described above. A submount 180 is also provided as was described above. Moreover, a conformal layer 140, 140' that comprises phosphor 142 is spaced apart from the diode region 110 and extends conformally onto the submount face 182a away from the light emitting diode die 100. The conformal layer may be spaced apart from the diode region by the transparent substrate 120 and/or by other means, such as a dome.

LEDs of FIGS. 1, 2, 3A to 3C, 4, 5, and 6A to 6B may also be provided in arrays on a same packing substrate (e.g., submount) as discussed in greater detail below. For example, an array of LEDs may be provided with the LEDs electrically connected in series and/or parallel. Each of the LEDs may have a horizontal structure with anode and cathode contacts of each LED provided between the LED and respective pads of the submount. Using direct LED die attach as discussed above, arrays of LED die may be provided with spacings between LED die of less than about 250 micrometers, less than about 100 micrometers, or even less than about 50 micrometers.

Some embodiments may provide relatively small area LED submounts for LED arrays with higher voltages where LED die bonding areas are more efficiently utilized to balance desired operating voltage and chip area and balanced with practical aspects of maintaining a chip spacing that provides ease of manufacture and less light absorption to provide increased efficiency and increased light output. Spacings between LED die, for example, may be less than about 75 micrometers, less than about 60 micrometers, less than about 40 micrometers, and/or in the range of about 40 micrometers to about 75 micrometers. Generally, smaller spacings between light emitting diode die may be desired, provided that sufficient space (e.g., greater than about 10 micrometers, or greater than about 20 micrometers) is provided to allow manufacturing placement and/or to reduce light absorption between light emitting diode die. According to some embodiments, spacings between LED die may be in the range of about 20 micrometers to about 500 micrometers, in the range of about 40 micrometers to about 150 micrometers, or even in the range of about 50 micrometers to about 100 micrometers.

In embodiments discussed below, LED die, submounts, and elements thereof may be provided as discussed above with respect to FIGS. 1, 2, 3A to 3C, 4, 5, and 6A to 6B. For ease of illustration, however, elements may be omitted from the following figures where inclusion of such elements would be overly repetitious. For example, diode regions 110 may be illustrated below without showing elements thereof (e.g., without separately showing n-type layer 112, p-type layer 114, conductive vias 162/172, etc.). Each of diode regions 110 discussed below, however, may include elements discussed above with respect to FIGS. 1 and 2.

FIGS. 7A and 7B illustrate plan and cross-sectional views of an array of six LED die 100a to 100f electrically coupled in parallel between anode and cathode pads 184 and 186 of submount 180. In addition, an electrostatic discharge (ESD) protection device 194 may be electrically coupled between anode and cathode pads 184 and 186. As shown, portions of anode pad 184 may extend between opposing portions of cathode pad 186, and LED die 100a to 100f may bridge gap 196 between anode and cathode pads 184 and 186. Moreover, all of LED die 100a to 100f may be provided within a circular area of a same lens 190. While each LED die 100a to 100f is shown with an individual phosphor layer 140 as discussed above with respect to FIG. 1, a continuous phosphor layer may be provided over all of the LED die 100a to 100f as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100f may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100f over cathode pad 186 may be significantly greater than portions of LED die 100a to 100f over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 7A and 7B, LED die 100a to 100f are arranged in a rectangular array of 2 rows and 3 columns (with each row including a same number of LED die and with each column including a same number of LED die). Spacing between adjacent LED die may be about 0.1 mm, and all of the LED die may be provided within a circular perimeter of a lens 190 having a diameter of about 2.55 mm. Each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 7A and into the plane of FIG. 7B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100f are sufficiently spaced from a perimeter of lens 190, an efficiency of light transmission through lens 190 may be improved. While lens 190 is not shown in the cross-section of FIG. 7B, it will be understood that lens 190 may substantially form a hemisphere or hemispherical section on submount 180 surrounding all of LED die 100a to 100f.

Figure 8A:
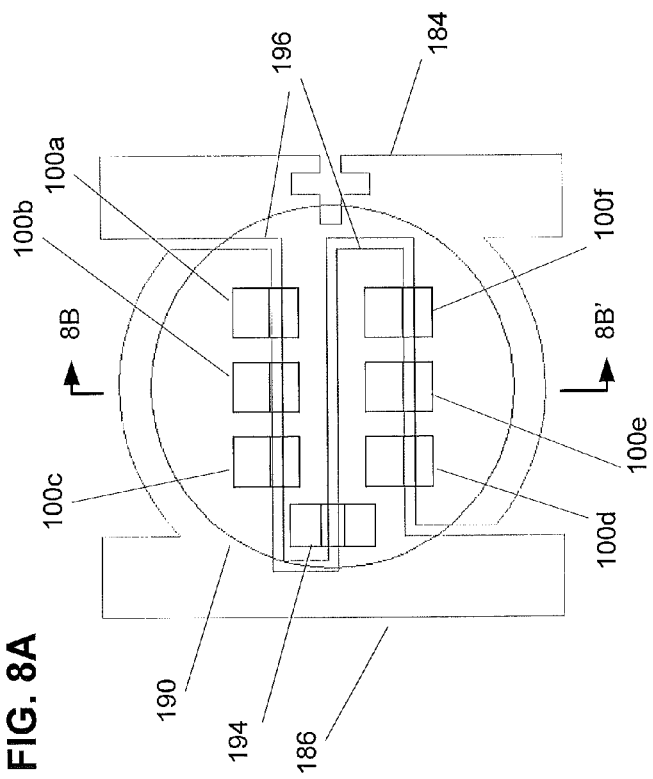
FIGS. 8A and 8B are respective plan and cross-sectional views of an array of packaged LED die electrically coupled in parallel on a submount including interdigitated cathode and anode pads according to various embodiments described herein.
Figure 8B:
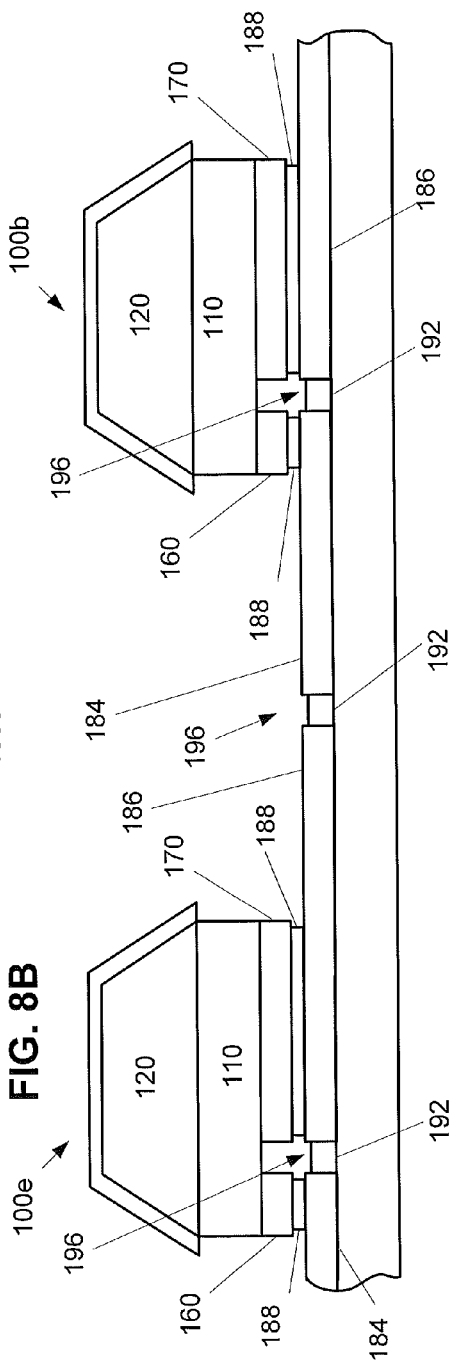

FIGS. 8A and 8B illustrate plan and cross-sectional views of an array of six LED die 100a to 100f electrically coupled in parallel between anode and cathode pads 184 and 186 of submount 180. In addition, an electrostatic discharge (ESD) protection device 194 may be electrically coupled between anode and cathode pads 184 and 186. As shown, anode and cathode pads 184 and 186 may be interdigitated, and LED die 100a to 100f may bridge gap 196 between anode and cathode pads 184 and 186. Moreover, all of the LED die 100a to 100f may be provided within a circular area of a same lens 190. While each LED die 100a to 100f is shown with an individual phosphor layer 140 as discussed above with respect to FIG. 1, a continuous phosphor layer may be provided over all of LED die 100a to 100f as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100f may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100f over cathode pad 186 may be significantly greater than portions of LED die 100a to 100f over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 8A and 8B, LED die 100a to 100f are arranged in a rectangular array of 2 rows and 3 columns. Dimensions of LED die and spacings therebetween may be the same as discussed above with respect to the structure of FIGS. 7A and 7B. In contrast to the structure of FIGS. 7A and 7B, however, LED die 100a to 100f of both rows of FIGS. 8A and 8B may be aligned such that anode contacts 160 of both rows are oriented toward a first side of submount 180 and cathode contacts 170 of both rows are oriented toward a second side of submount opposite the first side. While lens 190 is not shown in the cross-section of FIG. 8B, it will be understood that lens 190 may substantially form a hemisphere on submount 180 surrounding all of LED die 100a to 100f.

FIGS. 9A and 9B illustrate plan and cross-sectional views of a substantially circular array of seven LED die 100a to 100g electrically coupled in parallel between anode and cathode pads 184 and 186 of submount 180. In addition, an electrostatic discharge (ESD) protection device 194 may be electrically coupled between anode and cathode pads 184 and 186. As shown, all of LED die 100a to 100g may be provided within a circular area of a same lens 190. Moreover, each of the LED die 100a to 100g may share a same spacing relative to a perimeter of lens 190, and each of LED die 100a to 100g may be oriented radially relative to center of the circular array and/or relative to a center of lens 190. By providing that LED die 100a to 100g of the circular array are spaced symmetrically relative to the perimeter of lens 190, a more uniform and/or efficient light output may be provided through lens 190. As before, LED die 100a to 100g may bridge gap 196 between anode and cathode pads 184 and 186. While each LED die 100a to 100g is shown with an individual phosphor layer 140 as discussed above with respect to FIG. 1, a continuous phosphor layer may be provided over all of the LED die 100a to 100g as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100g may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100g over cathode pad 186 may be significantly greater than portions of LED die 100a to 100g over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 9A and 9B, each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (into the plane of FIG. 9B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100g are sufficiently spaced from a perimeter of lens 190, an efficiency of light transmission through lens 190 may be improved. While lens 190 is not shown in the cross-section of FIG. 9B, it will be understood that lens 190 may substantially form a hemisphere on submount 180 surrounding all of LED die 100a to 100g.

FIGS. 10A and 10B illustrate plan and cross-sectional views of a substantially circular array of six LED die 100a to 100f electrically coupled in parallel between anode and cathode pads 184 and 186 of submount 180. In addition, an electrostatic discharge (ESD) protection device 194 may be electrically coupled between anode and cathode pads 184 and 186 via respective metallic bonds 188. ESD protection device 194 may include contacts 195 electrically and mechanically coupled to anode and cathode pads 184 and 186. As shown, all of LED die 100a to 100f may be provided within a circular area of a same lens 190. Moreover, each of the LED die 100a to 100f may share substantially a same spacing relative to a perimeter of lens 190. In contrast to the circular array of Figured 9A and 9b, each of LED die 100a to 100f of FIGS. 10A and 10B may be oriented along a same axis (e.g., the vertical axis of FIG. 10A), and anode and cathode pads 184 and 186 may be interdigitated. By providing that LED die 100a to 100f of the circular array are spaced symmetrically relative to the perimeter of lens 190, a more uniform and/or efficient light output may be provided through lens 190. As before, LED die 100a to 100f may bridge gap 196 between anode and cathode pads 184 and 186. While each LED die 100a to 100f is shown with an individual phosphor layer 140 as discussed above with respect to FIG. 1, a continuous phosphor layer may be provided over all of the LED die 100a to 100f as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100f may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100f over cathode pad 186 may be significantly greater than portions of LED die 100a to 100f over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40 µm.

In the assembly of FIGS. 10A and 10B, each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (into the plane of FIG. 7B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100f are sufficiently spaced from a perimeter of lens 190, an efficiency of light transmission through lens 190 may be improved. While lens 190 is not shown in the cross-section of FIG. 7B, it will be understood that lens 190 may substantially form a hemisphere on submount 180 surrounding all of LED die 100a to 100f.

Figure 11A:
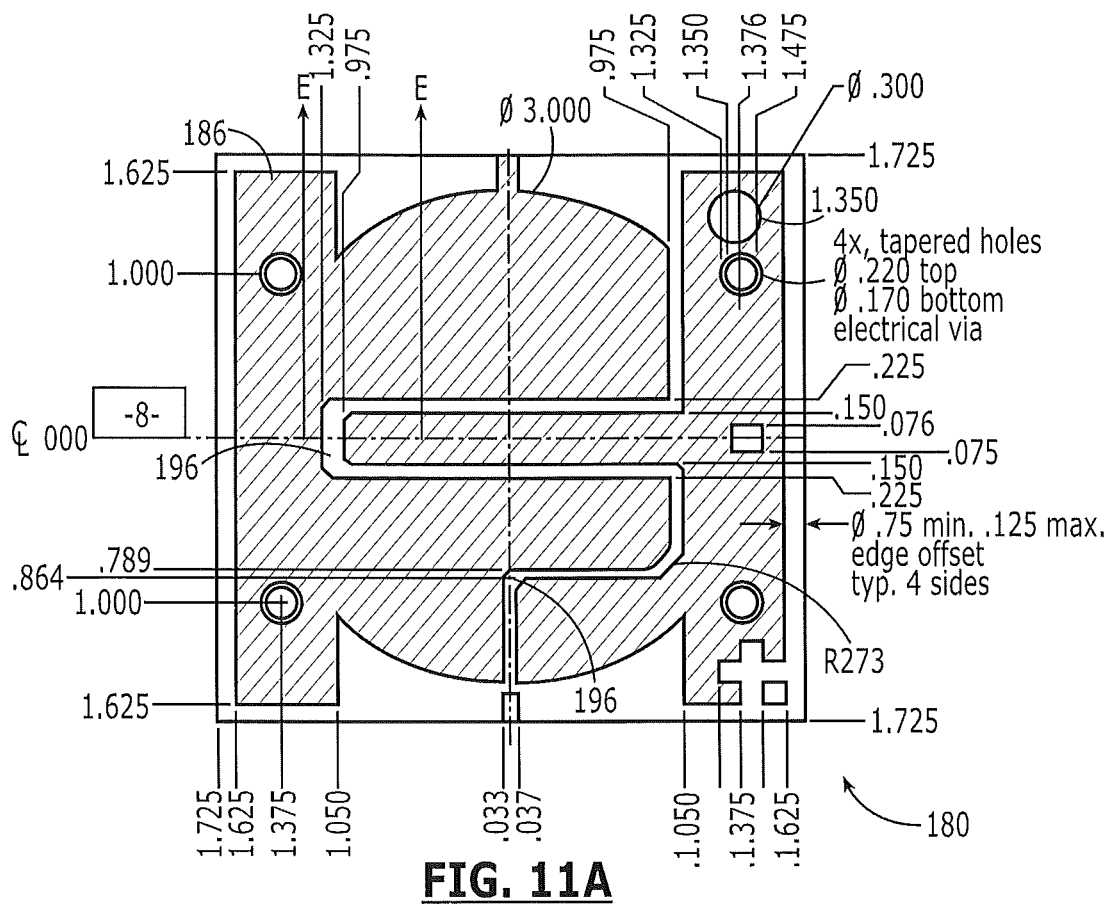
FIG. 11A is a plan view of a submount including cathode and anode pads for an array of LED die according to various embodiments described herein.
Figure 11B:
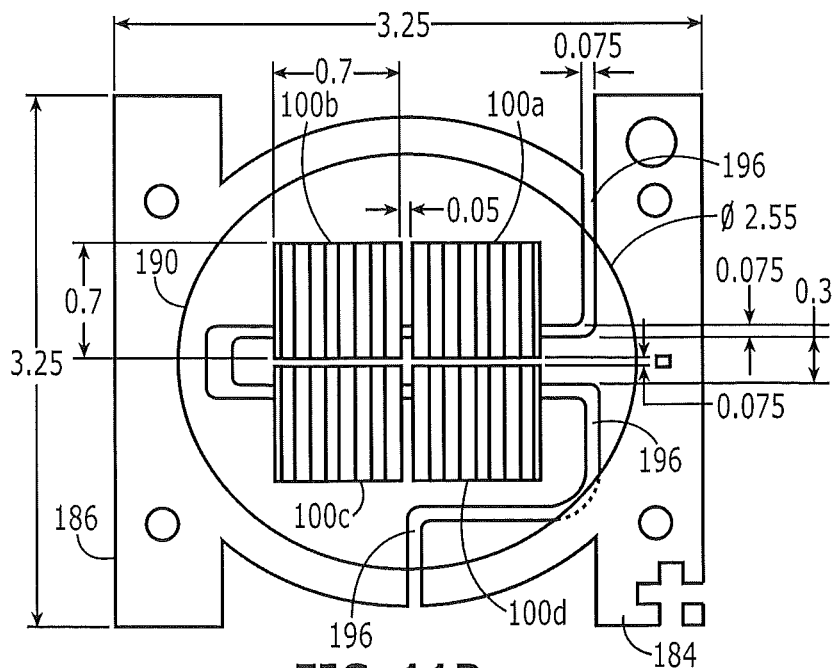
FIG. 11B is a plan view of an array of LED die electrically coupled in parallel on the submount of FIG. 11A.

FIG. 11A is a plan view of a submount 180 including anode and cathode pads 184 and 186 without LED die, and FIG. 11B is a plan view of an assembly including submount 180 with LED die 100a to 100d mounted thereon. A separate cross-sectional view is not provided for the structure of FIGS. 11A and 11B because the cross-sectional view would be substantially the same as that shown in FIG. 7A. As shown, four LED die 100a to 100d may be electrically coupled in parallel between anode and cathode pads 184 and 186 of submount 180. Moreover, portions of anode pad 184 may extend between opposing portions of cathode pad 186, and LED die 100a to 100d may bridge gap 196 between anode and cathode pads 184 and 186. Moreover, all of LED die 100a to 100d may be provided within a circular area of a same lens 190. Each LED die 100a to 100d may be provided with an individual phosphor layer 140 as discussed above with respect to FIG. 1, or a continuous phosphor layer may be provided over all of LED die 100a to 100d as discussed above with respect to FIG. 2.

As discussed above with respect to FIGS. 3A to 3C, surface areas of anode and cathode contacts (160 and 170) of LED die 100a to 100d may be asymmetric, with cathodes accounting for at least 70% of the combined contact area, at least 80% of the combined contact area, or even at least 90% of the combined contact area. Accordingly, LED die 100a to 100d may asymmetrically bridge the gap 196 between anode and cathode pads 184 and 186 of submount 180. Stated in other words, a contact area between cathode contacts and cathode pad 186 may be significantly greater than a contact area between anode contacts and anode pad 184, and portions of LED die 100a to 100d over cathode pad 186 may be significantly greater than portions of LED die 100a to 100d over anode pad 184.

As discussed above, a reflective and electrically insulating filler may be provided on submount body 182 between anode and cathode pads 184 and 186. By providing reflective filler between anode and cathode pads 184 and 186, light loss into a less reflective submount body may be reduced, and efficiency may thus be improved. Submount body 180, for example, may be alumina and/or aluminum nitride, and the filler may be white solder mask, a low modulus material (e.g., a silicone, a gel, etc.) loaded with titanium oxide particles, etc. A width of gap 196 (and filler therein) may be about 75 µm or less, or even less than about 40 µm. Further dimensions of submount 180 and LED die 100a to 100d are shown in FIGS. 11A and 11B with all dimensions given in units of millimeters (mm).

In the assembly of FIG. 11B, LED die 100a to 100d are arranged in a rectangular array of 2 rows and 2 columns (with each row including a same number of LED die and with each column including a same number of LED die). Spacing between adjacent columns of LED die may be about 0.05 mm, spacings between adjacent rows of LED die may be about 0.075 mm, and all of the LED die may be provided within a circular perimeter of a lens 190 having a diameter of about 2.55 mm. Each LED die may have a width of about 0.7 mm and a length of about 0.7 mm. As discussed above with respect to FIGS. 3A to 3C, widths of metallic bonds (i.e., solder layers 188) between LED anode contacts and anode pads 184 and between LED cathode contacts and cathode pads 186 (in the horizontal direction of FIG. 11B) may be at least 60% of a width of the LED die (e.g., at least 0.42 mm), at least 70% of a width of the LED die (e.g., at least 0.49 mm), or even at least 90% of a width of the LED die (e.g., at least 0.63 mm). By providing relatively large surface areas of contact, electrical and thermal resistances may be reduced. By providing that all of LEDs 100a to 100d are sufficiently spaced from a perimeter of lens 190, an efficiency of light transmission through lens 190 may be improved. While a cross-section of lens 190 is not shown, it will be understood that lens 190 may substantially form a hemisphere on submount 180 surrounding all of LED die 100a to 100d.

Figure 12A:
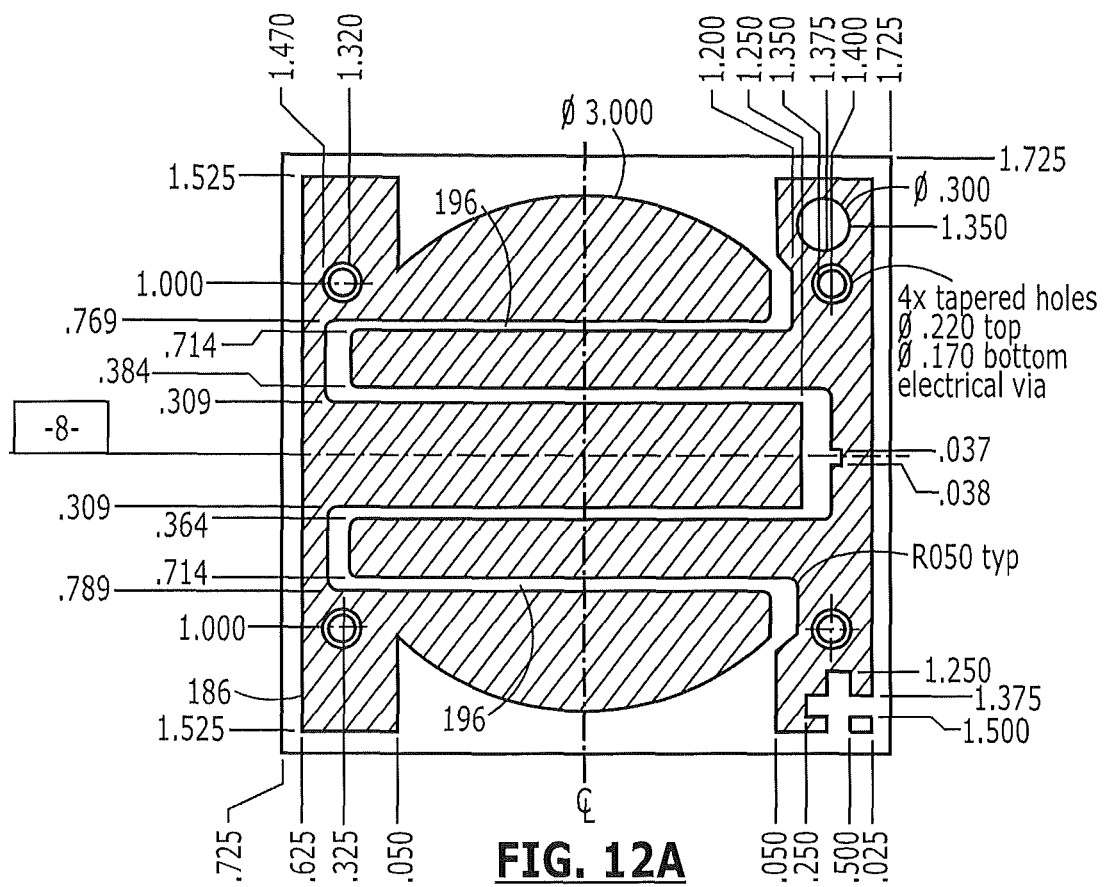
FIG. 12A is a plan view of a submount including interdigitated cathode and anode pads for an array of LED die according to various embodiments described herein.
Figure 12B:
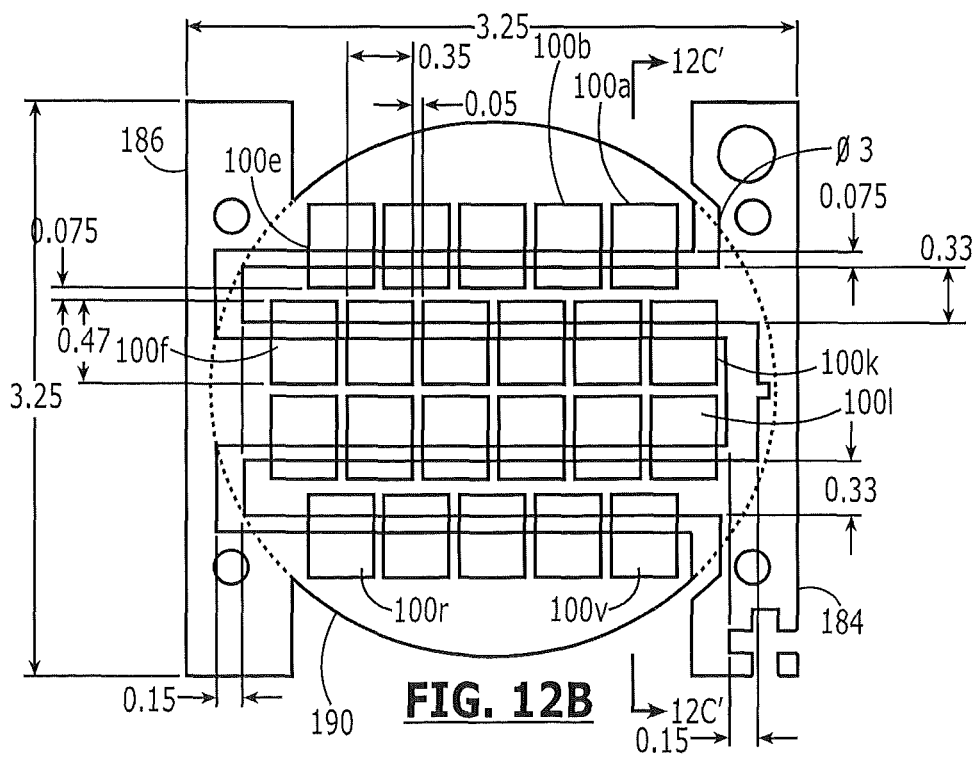
FIG. 12B is a plan view of an array of LED die electrically coupled in parallel on the submount of FIG. 12A.
Figure 12C:
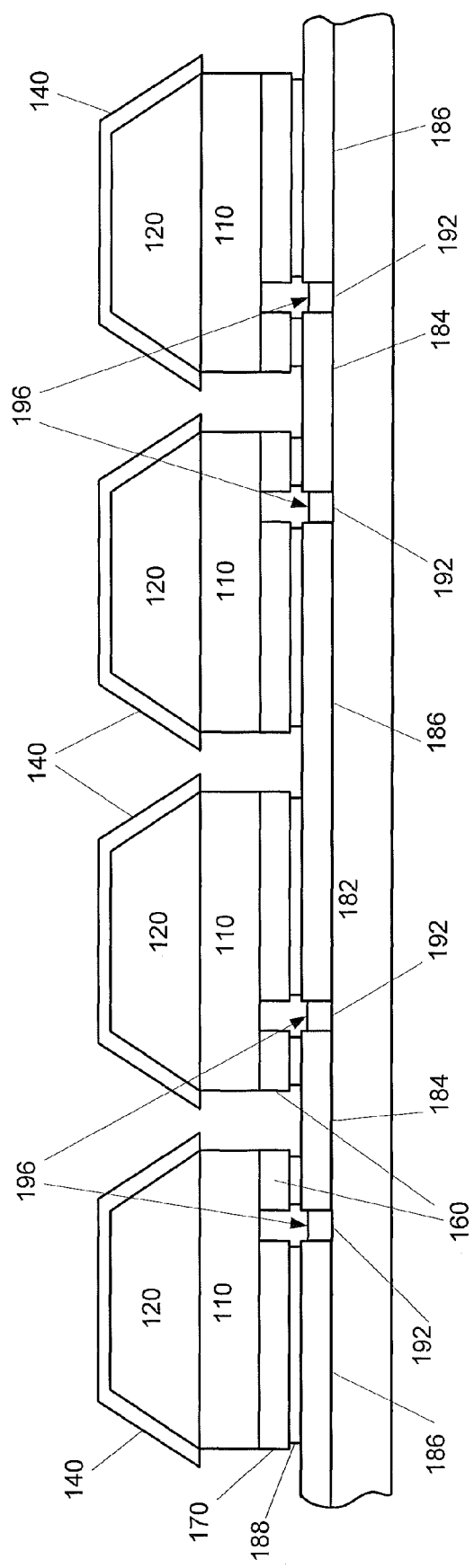
FIG. 12C is a cross-sectional view of a column of LED die from the array of FIG. 12B.

FIG. 12A is a plan view of a submount 180 including anode and cathode pads 184 and 186 without LED die, FIG. 12B is a plan view of an assembly including submount 180 with LED die 100a to 100v mounted thereon, and FIG. 12C is a cross-sectional view take through LED die 100a, 100j, 100m, and 100v (as indicated by section line 12C-12C'). In FIGS. 12A, 12B, and 12C, an array of twenty two LED die 100a to 100v are electrically coupled in parallel between anode and cathode pads 184 and 186 of submount 180. As shown, anode and cathode pads 184 and 186 may be interdigitated, and LED die 100a to 100v may bridge gap 196 between anode and cathode pads 184 and 186. Moreover, all of LED die 100a to 100v may be provided within a circular area of a same lens 190. While each LED die 100a to 100v is shown with an individual phosphor layer 140 as discussed above with respect to FIG. 1, a continuous phosphor layer may be provided over all of the LED die 100a to 100v as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100v may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100v over cathode pad 186 may be significantly greater than portions of LED die 100a to 100v over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 12A, 12B, and 12C, LED die 100*a* to 100*v* are arranged in a linear array of four rows, and LED die of at least some adjacent rows may be offset so the array does not have conventional columns. By providing that central rows (or lines) of the array are longer than peripheral rows (or lines) of the array (e.g., that central rows include a greater number of LED die than peripheral rows), an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.075 mm, and all of the LED die may be provided within a circular perimeter of a lens 190 having a diameter of about 3 mm. Each LED die may have a width of about 0.35 mm and a length of about 0.47 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 12B and into the plane of FIG. 12C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100*a* to 100*v* are sufficiently spaced from a perimeter of lens 190, an efficiency of light transmission through lens 190 may be improved. While lens 190 is not shown in the cross-section of FIG. 12C, it will be understood that lens 190 may substantially form a hemisphere on submount 180 surrounding all of LED die 100*a* to 100*v*.

Figure 13A:
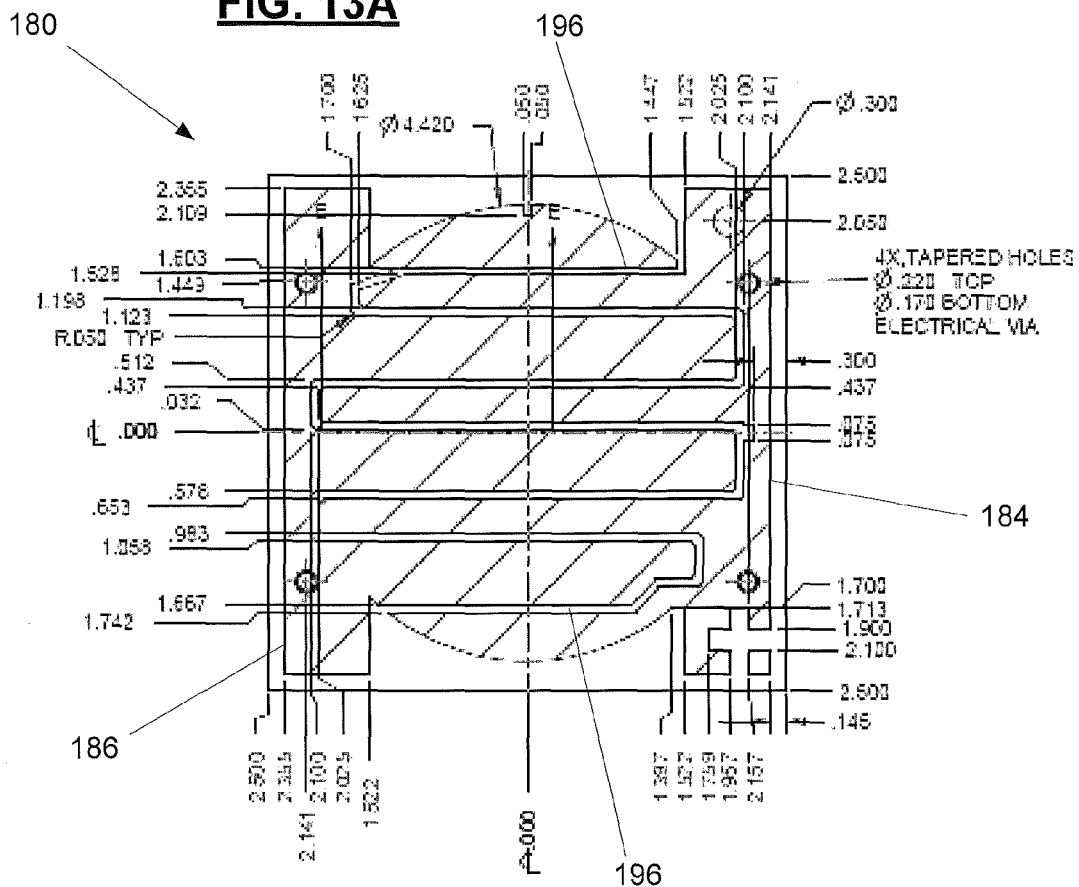
FIG. 13A is a plan view of a submount including interdigitated cathode and anode pads for an array of LED die according to various embodiments described herein.
Figure 13B:
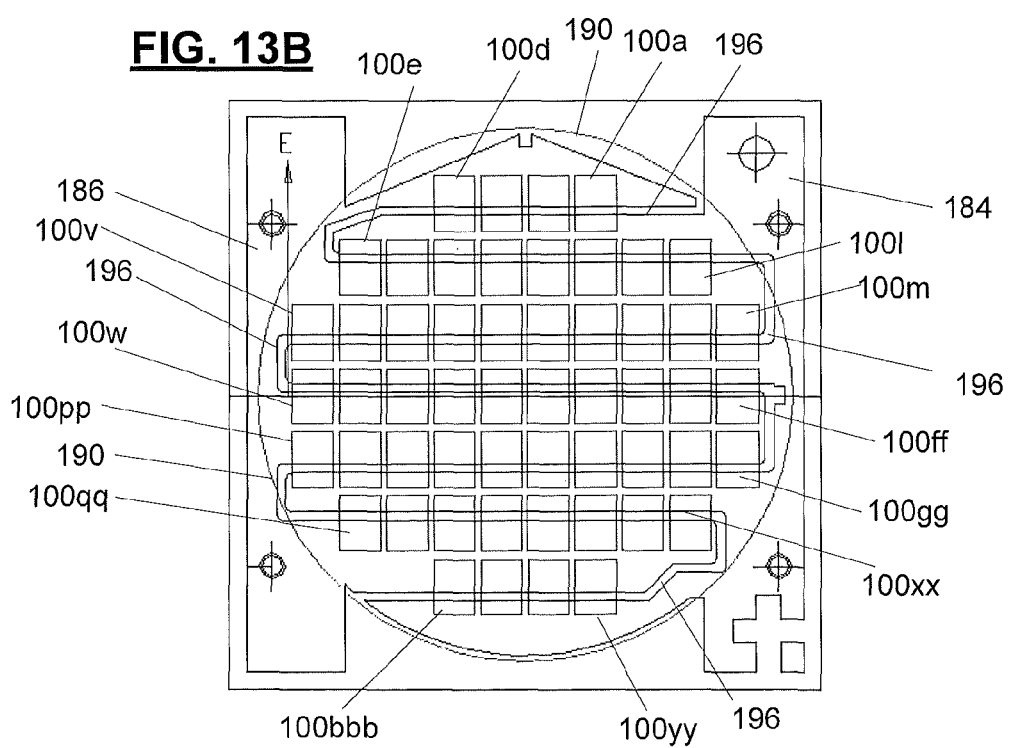
FIG. 13B is a plan view of an array of LED die electrically coupled in parallel on the submount of FIG. 13A.

FIG. 13A is a plan view of a submount 180 including anode and cathode pads 184 and 186 without LED die, and FIG. 13B is a plan view of an assembly including submount 180 with 54 LED die 100*a* to 100*bbb* mounted thereon. A separate cross-sectional view is not provided because the cross-sectional structure will be understood in light of the previously provided cross-sections. A cross-section taken through LED die 100*a*, 100*j*, 100*p*, and 100*cc* would be substantially the same as that illustrated in FIG. 12C.

In FIGS. 13A and 13B, an array of 54 LED die 100*a* to 100*bbb* are electrically coupled in parallel between anode and cathode pads 184 and 186 of submount 180. As shown, anode and cathode pads 184 and 186 may be interdigitated, and LED die 100*a* to 100*bbb* may bridge gap 196 between anode and cathode pads 184 and 186. Moreover, all of LED die 100*a* to 100*bbb* may be provided within a circular area of a same lens 190. While each LED die 100*a* to 100*bbb* may have an individual phosphor layer 140 as discussed above with respect to FIG. 1, a continuous phosphor layer may be provided over all of LED die 100*a* to 100*bbb* as discussed above with respect to FIG. 2.

As discussed above with respect to FIGS. 3A to 3C, surface areas of anode and cathode contacts of the LED die may be asymmetric, with cathode contacts accounting for at least 70% of the combined contact area, at least 80% of the combined contact area, or even at least 90% of the combined contact area. Accordingly, LED die 100*a* to 100*bbb* may asymmetrically bridge the gap 196 between anode and cathode pads 184 and 186 of submount 180. Stated in other words, a contact area between cathode contacts and cathode pad 186 may be significantly greater than a contact area between anode contacts and anode pad 184, and portions of LED die 100*a* to 100*bbb* over cathode pad 186 may be significantly greater than portions of LED die 100*a* to 100*bbb* over anode pad 184.

In addition, a reflective and electrically insulating filler may be provided on submount body 182 between anode and cathode pads 184 and 186. By providing reflective filler between anode and cathode pads 184 and 186, light loss into a less reflective submount body may be reduced, and efficiency may thus be improved. Submount body, for example, may be alumina and/or aluminum nitride, and filler may be white solder mask, a low modulus material (e.g., a silicone, a gel, etc.) loaded with titanium oxide particles, etc. A width of gap 196 (and filler therein) may be about 75 μm or less, or even less than about 40 μm.

In the assembly of FIGS. 13A and 13B, LED die 100*a* to 100*bbb* are arranged in a linear array of seven rows (or horizontal lines) and ten columns (or vertical lines). Moreover, central rows of the array are longer than peripheral rows of the array, so that central rows include a greater number of LED die than peripheral rows. Similarly, central columns of the array are longer than peripheral columns of the array, so that central columns include a greater number of LED die than peripheral columns. By providing that central rows and/or columns of the array are longer than peripheral rows and/or columns of the array, an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.075 mm, and all of the LED die may be provided within a circular perimeter of a lens 190 having a diameter of about 4.42 mm. Each LED die may have a width of about 0.35 mm and a length of about 0.47 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 12B and into the plane of FIG. 12C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100*a* to 100*bbb* are sufficiently spaced from a perimeter of lens 190, an efficiency of light transmission through lens 190 may be improved. While lens 190 is not shown in a cross-section, it will be understood that lens 190 may substantially form a hemisphere on submount 180 surrounding all of LED die 100a to 100bbb.

FIG. 14A is a plan view of a submount 180 including anode pad 184, cathode pad 186, and island pads 185 without LED die, FIG. 14B is a plan view of an assembly including submount 180 with LED die 100a to 100p mounted thereon, and FIG. 14C is a cross-sectional view take through LED die 100c to 100f (as indicated by section line 14C-14C'). In FIGS. 14A, 14B, and 14C, an array of 16 LED die 100a to 100p are electrically coupled in series between anode and cathode pads 184 and 186 of submount 180.

More particularly, island pads 185 may provide electrical connection between LED die that are electrically adjacent in the series connection between anode and cathode pads 184 and 186. Moreover, anode, cathode and island pads 184, 186, and 185 may be separated by gaps 196 and/or reflective and electrically insulating filler 192. Electrical coupling may thus be provided from anode pad 184 through LED die 100a, 100b, 100c, . . . 100p (in alphabetical order) to cathode pad 186. Moreover, each island pad 185 may provide electrical coupling between an anode contact 160 and a cathode contact of electrically adjacent LED die, and each LED die may bridge a gap between anode pad 184 and an island pad 185, between two island pads 185, or between an island pad 185 and cathode pad 186.

In addition, all of LED die 100a to 100p may be provided within a circular area of a same lens 190. While each LED die 100a to 100p is shown with an individual phosphor layer 140 as discussed above with respect to FIG. 1, a continuous phosphor layer may be provided over all of the LED die 100a to 100p as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100v may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100v over cathode pad 186 may be significantly greater than portions of LED die 100a to 100v over anode pad 184.

In addition, a reflective and electrically insulating filler 192 may be provided on submount body 182 between anode, island, and cathode pads 184, 185, and 186. By providing reflective filler 192 between pads 184, 185, and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 14A, 14B, and 14C, LED die 100a to 100p are arranged in a linear array of four rows (or horizontal lines) and four columns (or vertical lines). Moreover, central rows of the array are longer than peripheral rows of the array so that central rows have a larger number of LED die than peripheral rows, and central columns of the array are longer than peripheral columns of the array so that central columns have a larger number of LED die than peripheral columns. By providing that central rows and/or columns of the array are longer than peripheral rows and/or columns of the array, an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.05 mm, and all of the LED die may be provided within a circular perimeter of a lens 190 having a diameter of about 3 mm. Each LED die may have a width of about 0.35 mm and a length of about 0.47 mm. As discussed above with respect to FIGS. 3A to 3C, widths of metallic bonds (i.e., solder layers 188) between anode contacts 160 and respective pads 184/185 and between cathode contacts 170 and respective pads 185/186 (in the horizontal direction of FIG. 14B and into the plane of FIG. 14C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100p are sufficiently spaced from a perimeter of lens 190, an efficiency of light transmission through lens 190 may be improved. While lens 190 is not shown in the cross-section of FIG. 14C, it will be understood that lens 190 may substantially form a hemisphere on submount 180 surrounding all of LED die 100a to 100p.

Figure 15A:
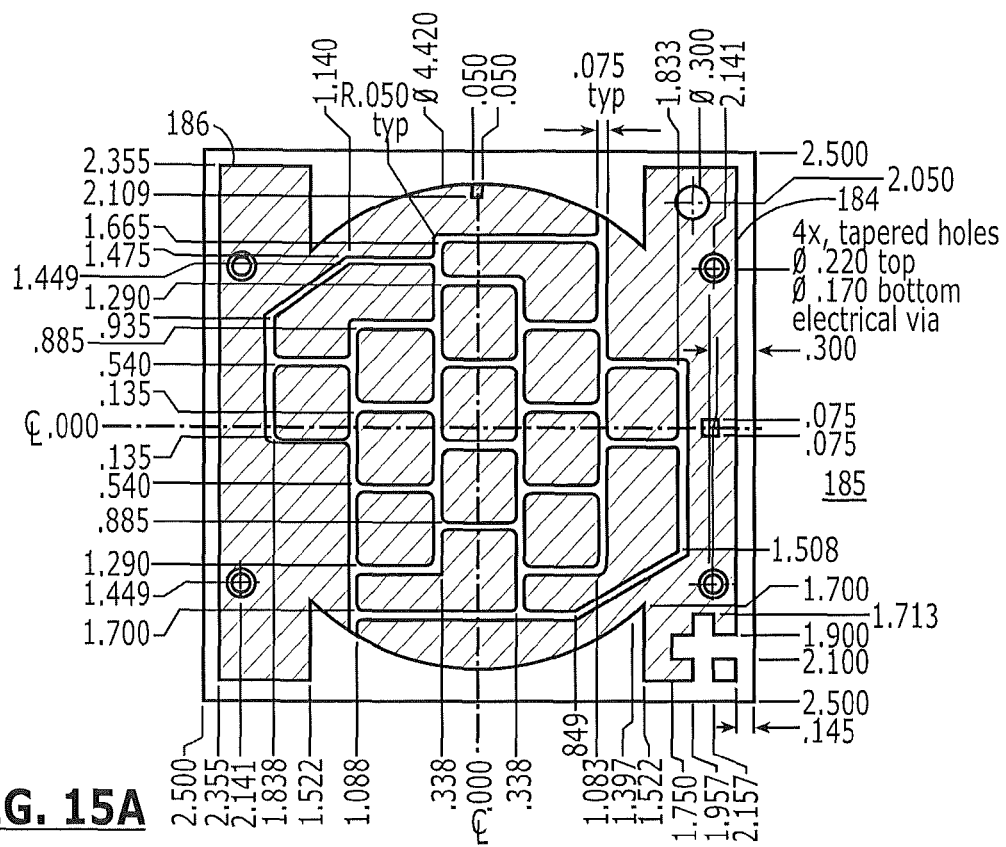
FIG. 15A is a plan view of a submount including cathode, island, and anode pads for an array of LED die according to various embodiments described herein.
Figure 15B:
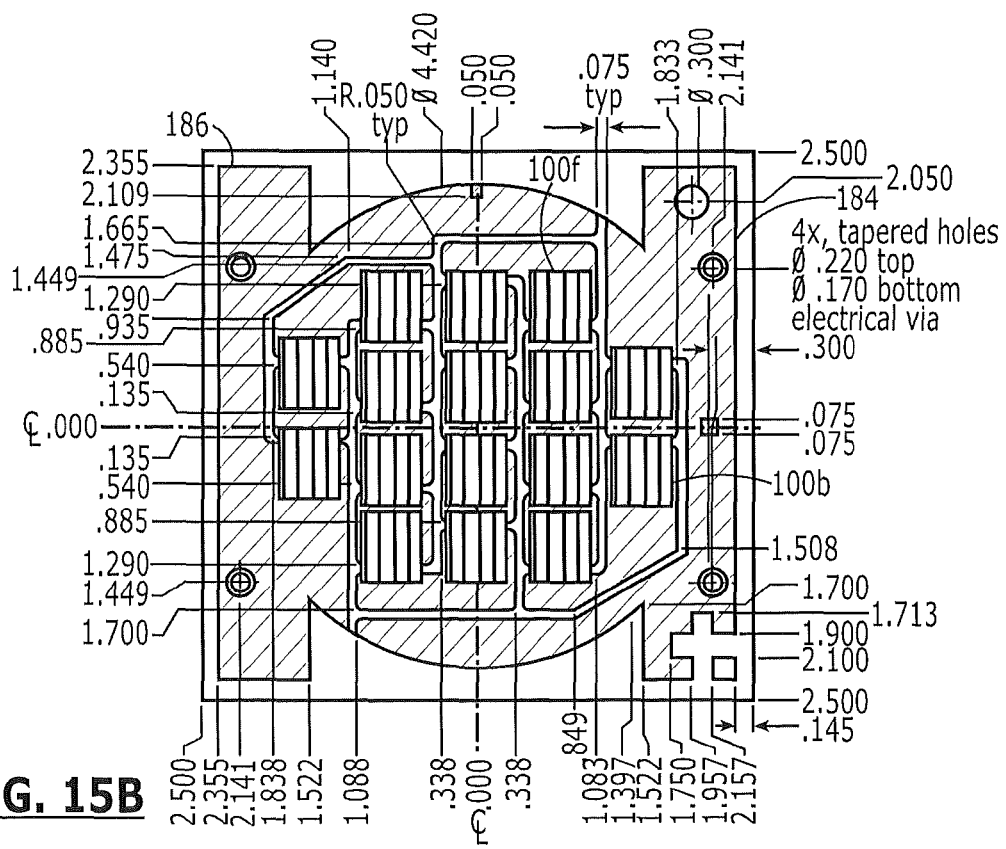
FIG. 15B is a plan view of an array of LED die electrically coupled in series on the submount of FIG. 15A.

FIG. 15A is a plan view illustrating a submount 180 with anode, island, and cathode pads 184, 185, and 186 for a series array of LED die, and FIG. 15B is a plan view of the submount of FIG. 15A populated with a serially connected array of LED die 100a to 100p. The structure of FIGS. 15A and 15B is similar to that of FIGS. 14A, 14B, and 14C, with the difference being that the submount of FIGS. 15A and 15B is provided for larger LED die having dimensions of 0.7 mm by 0.7 mm. Other dimensions of FIGS. 15A and 15B are provided in millimeters (mm). In FIG. 15B, the current path traverses vertically through each column from anode pad 184 to cathode pad 186. More particularly, the current path traverses down through the right most column (including LED die 100a to 100b), up through the next column (including LED die 100c to 100f), down through the next column (including LED die 100g to 100j), up through the next column (including LED die 100k to 100n), and down through the left most column (including LED die 100o to 100p).

Figure 16A:
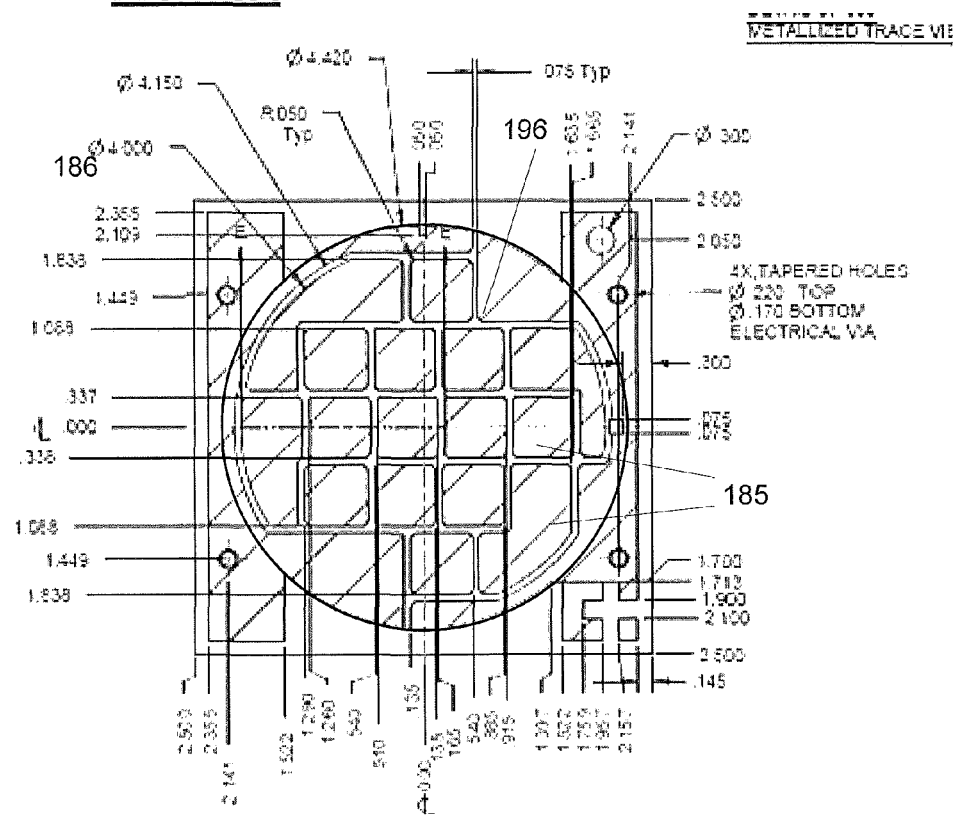
FIG. 16A is a plan view of a submount including cathode, island, and anode pads for an array of LED die according to various embodiments described herein.
Figure 16B:
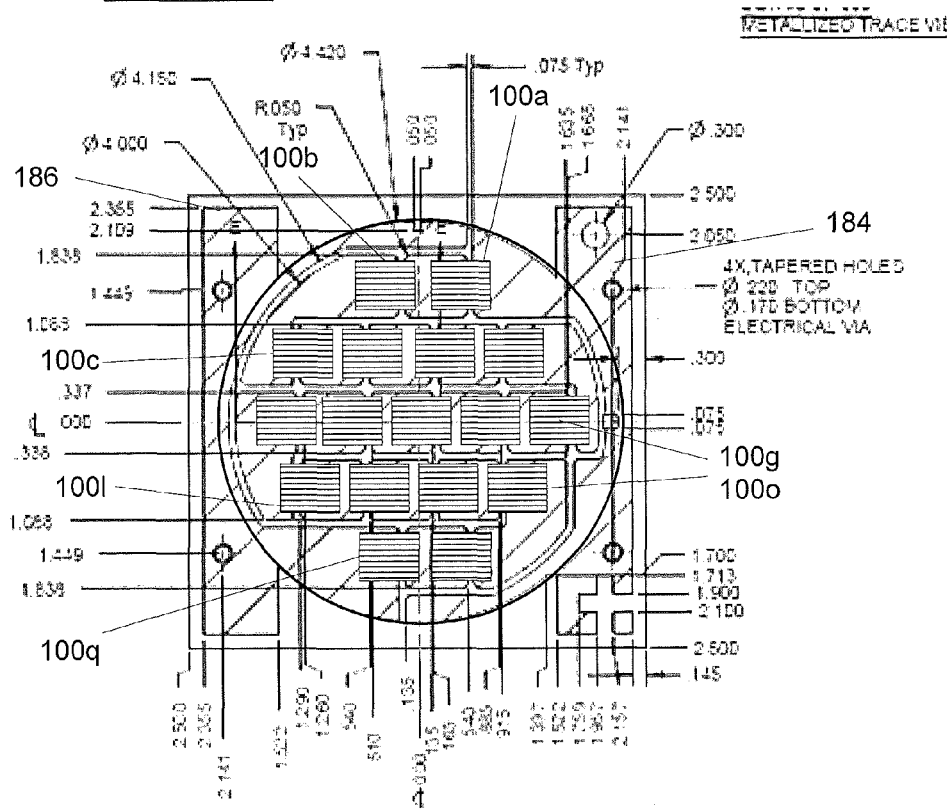
FIG. 16B is a plan view of an array of LED die with offset rows electrically coupled in series on the submount of FIG. 16A.

FIG. 16A is a plan view illustrating a submount 180 with anode, island, and cathode pads 184, 185, and 186 for a series array of LED die, and FIG. 16B is a plan view of the submount of FIG. 16A populated with a serially connected array of seventeen LED die 100a to 100q. The structure of FIGS. 16A and 16B is similar to that of FIGS. 15A and 15B, with differences being that the submount of FIGS. 16A and 16B provides horizontal current paths and offsets between LED die of adjacent rows. Dimensions of FIGS. 16A and 16B are provided in millimeters (mm). In FIG. 16B, the current path traverses horizontally through each row from anode pad 184 to cathode pad 186. More particularly, the current path traverses from right to left through the upper-most row (including LED die 100a to 100b), left to right through the next row (including LED die 100c to 100f), right to left through the next row (including LED die 100g to

100k), left to right through the next row (including LED die 100l to 100o), and right to left through the bottom most row (including LED die 100p to 100q).

FIG. 17A is a plan view illustrating yet another submount 180 with anode, island, and cathode pads 184, 185, and 186 for a series array of LED die, and FIG. 17B is a plan view of the submount of FIG. 17A populated with a serially connected array of sixteen LED die 100a to 100p. The structure of FIGS. 17A and 17B is similar to that of FIGS. 14A, 14B, and 14C. In FIG. 17B, the current path traverses vertically through each column from anode pad 184 to cathode pad 186. More particularly, the current path traverses down through the left most column (including LED die 100a to 100b), up through the next column (including LED die 100c to 100f), down through the next column (including LED die 100g to 100j), up through the next column (including LED die 100k to 100n), and down through the left most column (including LED die 100o to 100p).

Figure 18:
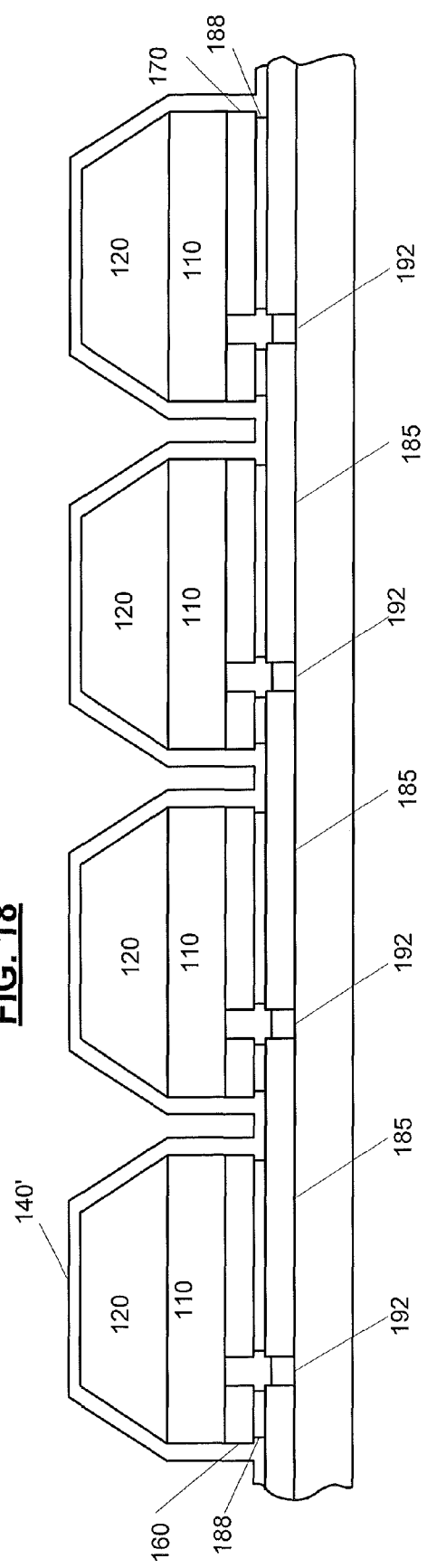
FIG. 18 is a cross-sectional view of an array of LED die with a continuous and conformal phosphor layer according to various embodiments described herein.
Figure 19:
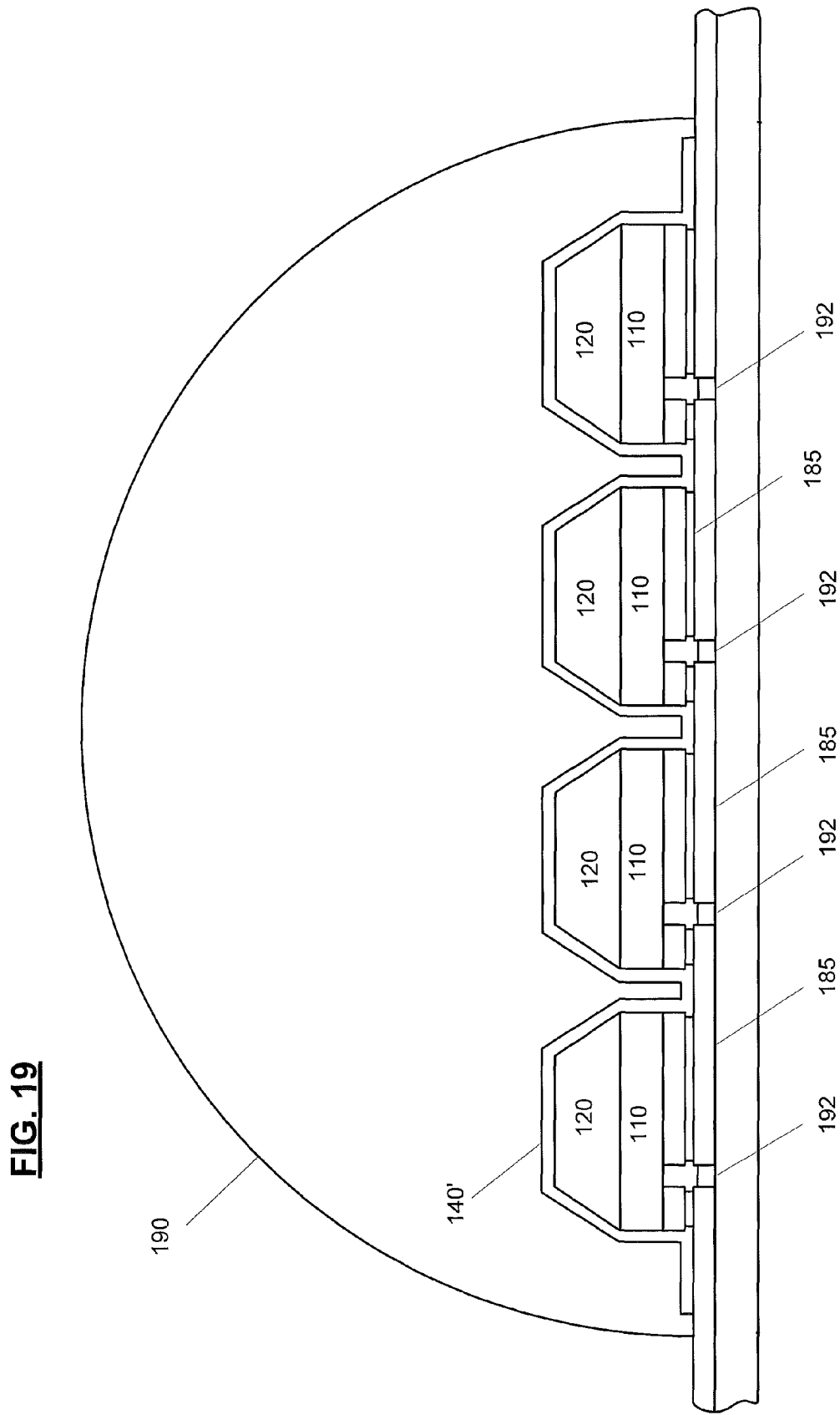
FIG. 19 is a cross-sectional view of an array of LED die with a lens according to various embodiments described herein.

As discussed above, for example, with respect to FIGS. 7B, 8B, 9B, 10B, 12C, and 14C, individual phosphor layers 140 may be provided for each LED die 100. According to other embodiments, a continuous and conformal phosphor layer 140' may be provided on the array of LED die 100 and on portions of the submount between LED die as shown in FIG. 18. The conformal phosphor layer 140', for example, may have a thickness that is less than a thickness of the LED die 100 and that is less than half of a spacing between adjacent LED die 100. With either individual or continuous phosphor layers 140 or 140', a single lens 190 may be provided on the array as shown in FIG. 19. While FIGS. 18 and 19 show a series arrangement of LED die 100 on island pads 185, a continuous and conformal phosphor layer 140' and/or a lens may be provided on any of the parallel or series arrays discussed above.

Figure 20:
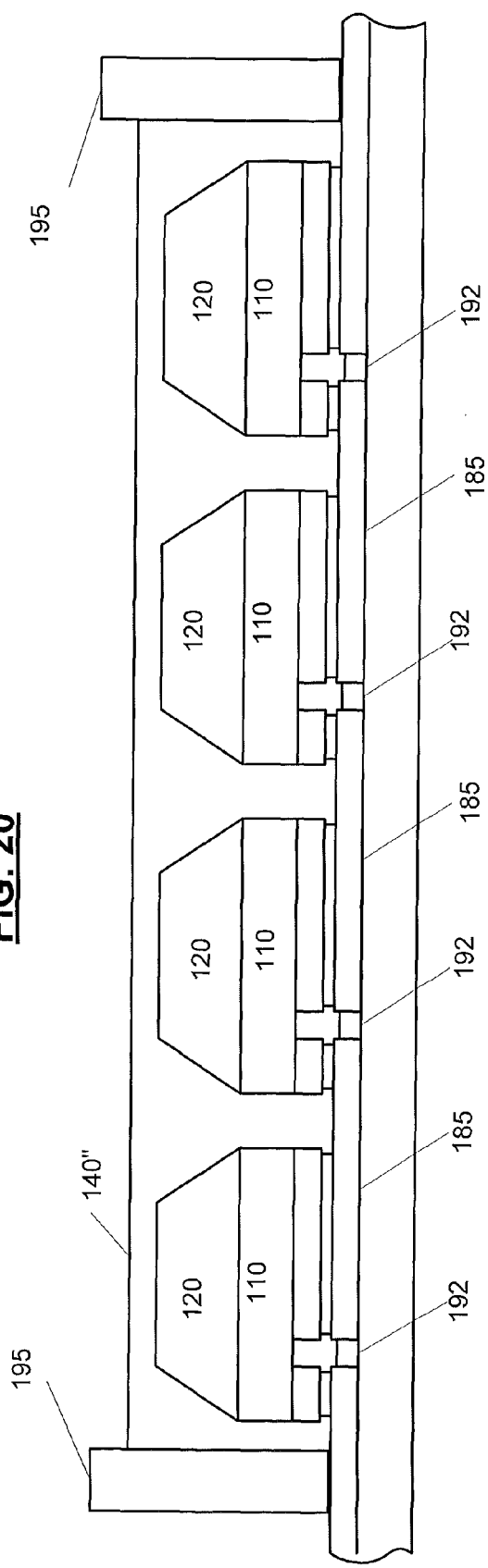
FIG. 20 is a cross-sectional view of an array of LED die with a dam containing a phosphor layer on the array according to various embodiments described herein.

According to still other embodiments, a dam 195 may surround the array of LED die 100 as shown in the cross-sectional view of FIG. 20, and the dam 195 may be used to confine a phosphor layer 140" that may be dispensed as a liquid therein and then solidified. The dam 195 and phosphor layer 140" may be substituted for a lens 190 and phosphor layer 140/140' in any of the structures discussed above. The dam 195, for example, may define a perimeter surrounding the array of LED die 100, wherein the perimeter defined by the dam 195 has a placement and dimensions corresponding to those of a perimeter of a lens 190 as discussed above with respect to FIGS. 7A, 8A, 9A, 10A, 11B, 12B, 13B, 14B, and 16B. As shown in FIG. 20, phosphor layer 140" may have a thickness that is greater than a thickness of LED die 100 (including cathode/anode contacts and bonding metal 188.) While dam 195 and thick phosphor layer 140" are shown with a series array of LED die 100 and island pads 185, dam 195 and thick phosphor layer 140" may be used with any of the parallel or series structures discussed above.

Figure 21A:
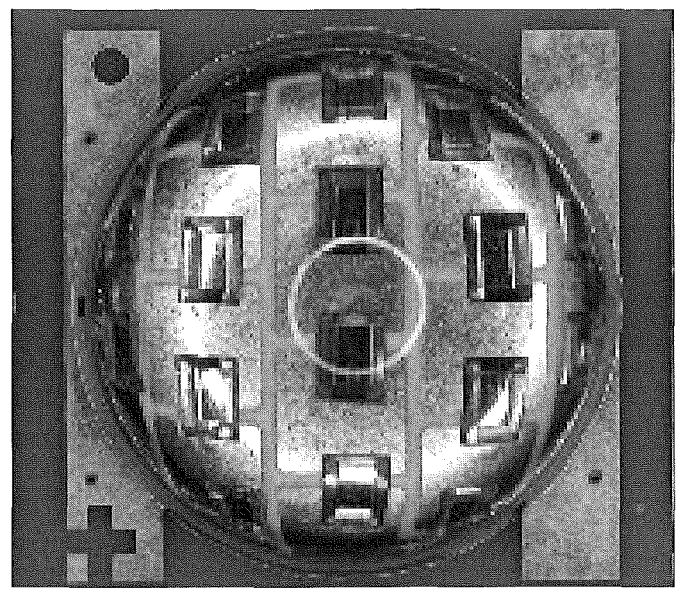
FIG. 21A is a photograph of a LED assembly including 16 LED die with a common encapsulating lens on a submount according to various embodiments described herein.

Examples of LED assemblies according to various embodiments will now be discussed with respect to the photographs of FIGS. 21A-B and 22A-D. In FIG. 21A, an LED assembly includes an array of sixteen LED die electrically coupled in series on a submount and encapsulated in a common lens, and in FIG. 21B, the LED assembly (including submount and LED die) is shown without the lens. Electrically conductive anode, island, and cathode pads of the submount of FIGS. 21A and 21B, for example, may be provided substantially as shown in FIG. 15A (with mirror image reversal). As shown, LED die of the array may be arranged in columns (more generally referred to as lines) with the serial current path defined up and down through columns of the array. Moreover, different columns of LEDs may include different numbers of LED die and/or LED die of adjacent columns may be offset so that the relatively large array of LED die may be arranged with sufficient spacing between a perimeter of the lens and all of the LED die of the array. Accordingly, an efficiency of light output from the array of LED die through the lens may be improved.

Figure 21B:
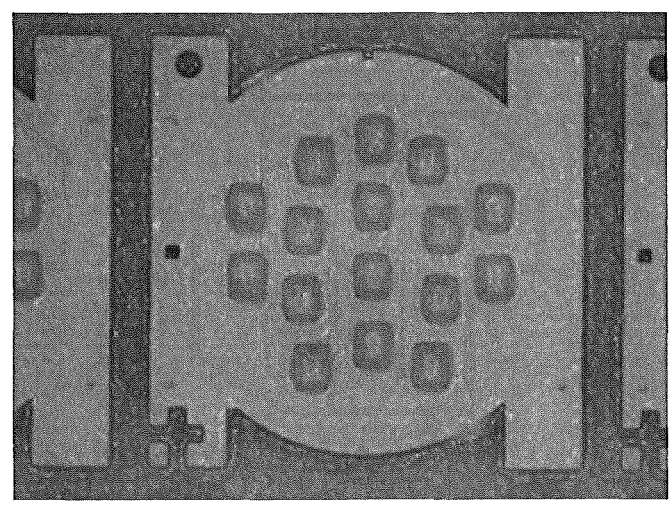
FIG. 21B is a photograph of the assembly of FIG. 21A without the encapsulating lens.

In the LED assembly of FIGS. 21A-B, sixteen LED die may be solder bonded to electrically conductive pads of the submount as discussed above, for example, with respect to FIGS. 1-6 and 15A-B. Each LED die of the array may have dimensions of about 350 micrometers by about 470 micrometers (for a surface area of about 164,500 square micrometers or about 0.1645 square mm), to provide a total active light emitting area for the LED assembly of about 2.63 square mm. The submount may have dimensions of about 5 mm by 5 mm for a surface area of about 25 square mm. Spacings between adjacent LED die may be about 425 micrometers. Moreover, LED die arrangements/spacings shown in FIG. 21B may provide improved luminous flux, for example, by reducing light absorption between LED die and/or by maintaining adequate spacings between all LED die of the array and a perimeter of the lens.

After testing, each of the 16 LED die may have a forward operating voltage Vf of about 3 volts, and the serially coupled array of the 16 LED die may have a forward operating voltage of about 46 volts. With an operating current of about 21.9 mA through the serially coupled array of 16 LED die, a forward operating voltage of about 46 volts, and a resulting power of about 1 Watt, the LED assembly of FIGS. 21A-B provided a luminous flux of about 146 μm and a color rendering index (CRI) of about 70.

A similar LED assembly with a smaller submount and a serially coupled array of smaller LED die may be provided as shown in FIGS. 22A-D. In FIG. 22A, an LED submount is provided for an array of sixteen LED die electrically coupled in series, and FIG. 22B-C show arrays of LED die packaged on the submount of FIG. 22A with different lenses/phosphors. Electrically conductive anode, island, and cathode pads of the submount of FIGS. 22A-D, for example, may be provided substantially as shown in FIGS. 14A and/or 17A. As shown, LED die of the array may be arranged in rows (more generally referred to as lines) with the serial current path defined to the left and right through rows of the array. Moreover, different rows and/or columns of LEDs may include different numbers of LED die so that the relatively large array of LED die may be arranged with sufficient spacing between a perimeter of the lens and all of the LED die of the array. Accordingly, an efficiency of light output from the array of LED die through the lens may be improved.

In the LED assembly of FIGS. 22A-D, sixteen LED die may be solder bonded to electrically conductive pads of the submount as discussed above, for example, with respect to FIGS. 1-6, 14A-C, and 17A-B. Each LED die of the array may have dimensions of about 240 micrometers by about 470 micrometers (for a surface area of about 76,800 square micrometers or about 0.0768 square mm), to provide a total active light emitting area for the LED assembly of about 1.23 square mm. The submount may have dimensions of about 3.5 mm by 3.5 mm for a surface area of about 12.25 square mm. Moreover, LED die arrangements/spacings for the LED arrays of FIGS. 22A-D may provide improved luminous flux, for example, by reducing light absorption between LED die and/or by maintaining adequate spacings between all LED die of the array and a perimeter of the lens.

After testing, each of the 16 LED die may have a forward operating voltage Vf of about 3.08 volts, and the serially coupled array of the 16 LED die may have a forward operating voltage of about 49.4 volts. With an operating current of about 21.9 mA through the serially coupled array of 16 LED die, a forward operating voltage of about 49.4 volts, and a resulting power of about 1.08 Watts (electrical Watts) consumed by the array of 16 LED die, the LED assembly of FIG. 22B provided a radiant flux of about 537 mW at a wavelength of 454 nm, the LED assembly of FIG. 22C provided a cool white output measured as 133 lumens at 6500K, and the LED assembly of FIG. 22D provided a warm white output measured as 104 lumens at 3080K. The different outputs of the assemblies of FIGS. 22B-D resulted from different phosphor combinations/compositions/concentrations/etc. used with the different assemblies. Measured individually, each LED die of FIGS. 22B-D may generate a light output having a wavelength of about 454 nm with an operating current of about 20 ma at a power of about 32 mw.

Accordingly, some embodiments may enable relatively small area LED submounts (e.g., 25 square mm or less, or even 12.25 square mm or less) for higher voltage application LED arrays. Such LEDs, for example, may provide Vfs of at least about 12V, at least about 24V, at least about 36V, at least about 42V, at least about 48V, at least about 50V, or even greater than 54V (assuming that each LED die has a Vf of about 3 V) with corresponding higher efficiencies due to lower current requirements. Certain embodiments may enable very high voltage operation (e.g., greater than about 45V as discussed above with respect to FIGS. 21A-B and 22A-D) with efficiency numbers for individual LED die as set forth, for example, in U.S. application Ser. No. 13/018,013 filed Jan. 31, 2011, the disclosure of which is hereby incorporated herein in its entirety by reference.

According to some embodiments discussed above, LED assemblies may include serially coupled LED die on a submount having a total surface area in the range of about 0.5 square mm to about 5.0 square mm, and more particularly, in the range of about 1 square mm to about 3 square mm. Each individual LED die have a surface area in the range of about 0.01 square mm to about 0.3 square mm, and more particularly, in the range of about 0.05 square mm to about 0.2 square mm. Accordingly, a serially coupled array of 16 LED die may provide a combined LED die surface area in the range of about 0.16 square mm to about 4.8 square mm, and more particularly, in the range of about 0.8 square mm to about 3.2 square mm. With an array of 16 LED die electrically coupled in series, the array may provide a total forward operating voltage greater than about 45 volts, greater than about 48 volts, greater than about 50 volts, or even greater than about 54 volts. As discussed above, the LED die may be solder bonded to submount pads eliminating wirebonds between LED die of the array and improving electrical coupling between LED die of the array.

The numerous embodiments discussed above may thus provide an electronic device including a plurality of light emitting diode (LED) die electrically and mechanically bonded to a submount, with each LED die including a diode region, an anode contact, and a cathode contact. More particularly, each LED die may include the diode region having first and second opposing faces and including therein an n-type layer and a p-type layer with the first face between the second face and the packaging substrate. The anode contact of each LED die may ohmically contact the p-type layer and may extend on the first face between the first face and the packaging substrate, and the cathode contact may ohmically contact the n-type layer and may extend on the first face between the first face and the packaging substrate. Moreover, adjacent LED die may be spaced apart by distances in the range of about 20 micrometers to about 500 micrometers, by distances in the range of about 40 micrometers to about 150 micrometers, or even by distances in the range of about 50 micrometers to about 100 micrometers.

These electronic devices may be assembled by sequentially (and individually) placing each of a plurality of light emitting diode (LED) die on the submount, and by performing a reflow operation to provide a metallic bond between anode and cathode contacts of each of the LED die and the submount. Moreover, the metallic bonds may be provided using eutectic solder bonds. By sequentially/individually placing relatively small LED die, the LED die can be individually tested to provide improved yield relative to large area LED die and/or relative to arrays of LED die maintained on a growth substrate during placement operations. According to some embodiments, flux may be provided between the LED die and the submount, and the reflow operation may be performed after placing all of the LED die on the submount. According to some other embodiments, a temperature of the submount may be maintained above a reflow temperature for metallic bonding while the plurality of LED die are placed on the submount.

The plurality of LED die may be electrically coupled in series, wherein each of the plurality of LED die has a forward operating voltage in the range of about 2 volts to about 4 volts, and wherein a forward operating voltage of the serially coupled plurality of LED die is at least about 12 volts. More particularly, each of the LED die may have a forward operating voltage in the range of about 2.5 volts to about 3.5 volts (e.g., about 3 volts), and the forward operating voltage of the serially coupled plurality of LED die may be at least about 12 volts, at least about 24 volts, at least about 36 volts, at least about 48 volts, or even at least about 54 volts. For example, the plurality of serially coupled LED die may include at least about 4 LED die, at least about 8 LED die, at least about 12 LED die, or even at least about 16 LED die.

According to some other embodiments, the plurality of LED die may be electrically coupled in parallel. By using an array of a larger number of smaller LED die in parallel as opposed to using fewer or even one larger LED die, an effective yield of LED die may be improved because a larger percentage of a fabrication wafer will be converted to useful LED die when smaller die are produced. For example, the plurality of parallel LED die may include at least about 4 LED die, at least about 8 LED die, at least about 12 LED die, or even at least about 16 LED die. Going to LED die sizes beyond 1 mm or 1.4 mm may be prohibitive from a cost and manufacturing perspective to provide desired performance and light extraction. Instead of a 1.4 mm LED die, for example, four 700 micrometer LED die may be used. Die yield percentage per wafer may increase as LED die size is reduced. For a 700 micrometer LED die, an extraction efficiency per chip may improve because the ratio of outer to inner surface is reduced. Increasing a thickness of a large LED die (e.g., a 1.4 mm LED die) to increase extraction efficiency may be impractical due to costs for dicing saw blades and for starting substrate thickness.

Moreover, the plurality of LED die may be bonded to a surface of the submount having a surface area of less than about 85 mm$^2$, less than about 65 mm$^2$, less than about 30 mm$^2$, or even less than about 15 mm$^2$. As noted above, arrays of LED die including at least 4, at least 8, at least 12, or even at least 16 LED die may be provided on these relatively small submounts.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. An electronic device comprising:
   a packaging substrate having a packaging substrate face
   a first electrically conductive contact pad at the packaging substrate face;
   a second electrically conductive contact pad at the packaging substrate face, the second electrically conducting pad comprising first and second portions disposed on opposite sides of an intervening portion of the first electrically conductive contact pad;
   a first light emitting diode die bridging the first portion of the second electrically conductive pad and the intervening portion of the first electrically conductive pad, the first light emitting diode die including first anode and cathode contacts respectively coupled to the first and second electrically conductive pads using metallic bonds, wherein widths of the metallic bonds between the first anode contact and the first electrically conductive pad and between the first cathode contact and the second electrically conductive pad are at least 60 percent of a width of the first light emitting diode die;
   a second light emitting diode die the second portion of the second electrically conductive pad and the intervening portion of the first electrically conductive pad, the second light emitting diode die including second anode and cathode contacts respectively coupled to the first and second electrically conductive pads using metallic bonds, wherein widths of the metallic bonds between the second anode contact and the first electrically conductive pad and between the second cathode contact and the second electrically conductive pad are at least 60 percent of a width of the first light emitting diode die; and
   a filler on the packaging substrate between the first and second electrically conductive pads, wherein the filler is reflective and electrically insulating.

2. An electronic device according to claim 1 wherein contact areas of the first light emitting diode die with the first and second electrically conductive pads are asymmetric, and wherein contact areas of the second light emitting diode die with the first and second electrically conductive pads are asymmetric.

3. An electronic device according to claim 2 wherein there is at least a 25 percent difference between a contact area of the metallic bond between the first anode contact and the first electrically conductive pad and a contact area of the metallic bond between the first cathode contact and the second electrically conductive pad, and wherein there is at least a 25 percent difference between a contact area of the metallic bond between the second anode contact and the first electrically conductive pad and a contact area of the metallic bond between the second cathode contact and the second electrically conductive pad.

4. An electronic device according to claim 1 wherein a combined contact area of the metallic bonds between the first anode contact and the first electrically conductive pad and between the first cathode contact and the second electrically conductive pad is at least 70 percent of a surface area of the first light emitting diode die, and wherein a combined contact area of the metallic bonds between the second anode contact and the first electrically conductive pad and between the second cathode contact and the second electrically conductive pad is at least 70 percent of a surface area of the second light emitting diode die.

5. An electronic device according to claim 1 wherein the intervening portion of the first electrically conductive pad comprises a finger extending between the first and second portions of the second electrically conductive pad.

6. An electronic device according to claim 1,
   wherein the first light emitting diode die comprises a first diode region including therein a first n-type layer and a first p-type layer, wherein the first anode contact ohmically contacts the first p-type layer, and wherein the first cathode contact ohmically contacts the first n-type layer, and
   wherein the second light emitting diode die comprises a second diode region including therein a second n-type layer and a second p-type layer, wherein the second anode contact ohmically contacts the second p-type layer, and wherein the second cathode contact ohmically contacts the second n-type layer.

7. An electronic device according to claim 1 further comprising a third light emitting diode die bridging the first portion of the second electrically conductive pad and the intervening portion of the first electrically conductive pad, the third light emitting diode die including third anode and cathode contacts respectively coupled to the first and second electrically conductive pads using metallic bonds.

* * * * *